United States Patent [19]
Onaka et al.

[11] Patent Number: 5,696,859
[45] Date of Patent: Dec. 9, 1997

[54] OPTICAL-FILTER ARRAY, OPTICAL TRANSMITTER AND OPTICAL TRANSMISSION SYSTEM

[75] Inventors: Hiroshi Onaka; Hideyuki Miyata; Nobuhiro Fukushima, all of Kawasaki, Japan

[73] Assignee: Fujitsu Limited, Kanagawa, Japan

[21] Appl. No.: 534,726

[22] Filed: Sep. 27, 1995

[30] Foreign Application Priority Data

Feb. 23, 1995 [JP] Japan .................. 7-035706

[51] Int. Cl.$^6$ .................. G02B 6/293
[52] U.S. Cl. .................. 385/24; 359/187; 372/20; 372/32
[58] Field of Search .................. 385/15, 24, 31; 359/187, 188; 372/9, 20, 28, 29, 32

[56] References Cited

U.S. PATENT DOCUMENTS

| | | | |
|---|---|---|---|
| 4,700,352 | 10/1987 | Shikada et al. | 372/20 |
| 5,077,619 | 12/1991 | Toms | 359/187 |
| 5,161,044 | 11/1992 | Nazarathy et al. | 359/187 X |
| 5,184,244 | 2/1993 | Nishimura et al. | 359/187 |
| 5,311,005 | 5/1994 | Visocchi | 359/187 X |
| 5,347,529 | 9/1994 | Noe | 372/28 |
| 5,570,221 | 10/1996 | Fujita | 359/161 |

FOREIGN PATENT DOCUMENTS 5-281480  10/1993  Japan .

OTHER PUBLICATIONS

T. Oguchi and I. Nishi, "Long-term spectral stability of $TiO_2/SiO_2$ thin film filters deposited by Ion-assisted deposition" CLEO 1987 TUK3 (Apr. 1987).

F. Forghieri et al., "Reduction of four-wave-mixing cross talk in WDM systems using unequally spaced channels", OFC/IOOC '93 Technical Digest FC4 (1993).

M. Kihara et al., "Loss Characteristics of Thermally Diffused Expanded Core Fiber", IEEE Photonics Technology Letters vol. 4 No. 12 pp. 1390-1391, Dec. 1992.

*Primary Examiner*—John D. Lee
*Attorney, Agent, or Firm*—Helfgott & Karas, P.C.

[57] ABSTRACT

An optical transmitter provided by the present invention comprises: a light source; a band-pass filter for filtering a light generated by the light source; a light splitting means for splitting a light output by the band-pass filter into at least two split lights; an optical receiving unit for converting one of the split lights into an electrical signal having a level proportional to the intensity of the split light; and a control means for receiving the electrical signal for use in controlling the wavelength of the light source so as to sustain the intensity of the split light at a fixed value. With the configuration described above, fluctuations in wavelength occurring on the transmitter side can be reduced. On the top of that, by applying this optical transmitter to a WDM system, a system cold start can be done with ease.

12 Claims, 36 Drawing Sheets

OPTICAL-FILTER ARRAY, OPTICAL TRANSMITTER AND OPTICAL TRANSMISSION SYSTEM

BACKGROUND OF THE INVENTION

1. Field of the Invention

The present invention relates to an optical transmitter, an optical transmission system and an optical reception system adapted for wavelength multiplexing technique, and an optical-filter array applicable to these systems.

2. Description of the Related Art

In recent years, the advent of an erbium-doped optical-fiber amplifier (EDFA) has led to studies of an optical transmission system which directly amplifies a light beam. Since the EDFA has a wide amplification band of several ten nanometers in 1.5 micrometers band, it is possible to collectively amplify signal lights processed through wavelength division multiplexing (WDM) by the use of a plurality of light sources. For this reason, research and development of an optical transmission system employing EDFAs and adopting the WDM technique, which is typically aimed at capacity enhancement of a trunk system, are carried out aggressively.

In a transmission system employing a plurality of optical repeaters each equipped with an EDFA, the total amplification band (band that can be used for transmission with factors such as variations in optical output and the SN ratio taken into consideration is meant) is narrower than the amplification band of each individual EDFA. None the less, we consider that a total amplification of about 15 nm is preservable. In this case, simple arithmetic indicates that it is possible to transmit 16 signal lights whose wavelengths are separated from each other by a difference of 1 nm. When adopting a high-density WDM technique which packs in wavelengths at equal intervals of 1 nm in this way, it becomes necessary to control the differences in wavelength among light sources and to control the absolute values of the wavelengths at the optical transmitter.

The reasons for this necessity are listed as follows:

(1) The laser diode (LD) which serves as a light source exhibits variations in oscillation wavelength caused by variations in temperature. The variation in oscillation wavelength due to a change in temperature is typically 0.1 nm/C. Even if the temperature of the LD module is controlled, the temperature of the LD will change slightly when the ambient temperature varies greatly. As a result, the wavelength also changes as well. In spite of the fact that the temperature of the LD module is controlled, the temperature of the LD does change because the LD and a temperature sensor used in the temperature control are separated away from each other. As a result, even if the temperature of the temperature sensor can be kept at a constant value, a temperature gradient is developed between the LD and the temperature sensor which temperature gradient changes with variation in the ambient temperature, inevitably giving rise to a change in LD temperature.

(2) In some cases, the wavelength changes because of aged deterioration. At the present time, we do not exactly know yet how much an LD deteriorates with the lapse of time. In order to assure a stable operation, however, it is deemed necessary to design a system by assuming a variation in wavelength of at least about 0.5 nm due to the aged deterioration.

(3) When the direct-modulation technique is applied to the LD, a bias current supplied to the LD is controlled in order to keep quantities such as the optical output and the modulation amplitude at constant values. When the bias current is changed by the control, however, the oscillation wavelength also changes inevitably.

When the oscillation wavelength varies on the transmitter side, the wavelength of a signal light received on the receiver side may get out off a band of receivable wavelengths which band has been selected in the wavelength selecting receiver in order to discriminatively receive a desired signal light. As a result, the reception quality may deteriorate or, in some cases, the reception becomes impossible. If a wavelength selecting optical filter embedded in the wavelength selecting receiver has a tracking function for controlling the transmission wavelength so as to follow variations in wavelength which occur in a signal light to be received, variations in wavelength occurring on the receiver side up to a certain degree can be tolerated. When the wave-length of the signal source employed in the transmitter greatly changes, however, the wavelength may approach that of a signal light on an adjacent channel in the WDM system. In this case, the signal power of the adjacent channel becomes a cross-talk component of the signal to be received naturally, causing the reception quality to deteriorate.

In the case of the WDM technique applied to a closed system connecting a transmission point to a reception point, the absolute values of the wavelengths of the light sources employed in the transmitters are not so important. Accordingly, wavelengths can be determined appropriately so that the wavelength characteristics of optical components and EDFAs satisfy required values determined in advance. In general, it is sufficient to control differences in wavelength among light sources employed in the transmitter. In the case of the WDM technique applied to a system wherein a transmission point is connected to a plurality of transmission points or several transmission points are connected to a number of transmission points as a variety of nodes are connected to each other in a network, on the other hand, it becomes necessary to control the absolute values of the wavelengths of the light sources.

As described above, in order to sustain a stable operation on the receiver side of a system adopting the WDM technique, it is necessary to stabilize differences in wavelength or the absolute values of wavelengths on the transmitter side. In concrete terms, in order to avoid the effects of cross talk on the receiver side, it is necessary to stabilize the difference in wavelength between any two adjacent channels in the WDM system so as to keep variations in wavelength difference within 1/10 to 1/5 of the wavelength difference. In the case of a wavelength difference of 1 nm, for example, it is necessary to keep variations in wavelength difference within the range about 0.1 to 0.2 nm. It should be noted that these values depend on the performance of a wavelength selecting filter embedded in the receiver. Even in a case where the control of the absolute values of wavelengths is required, it is necessary to control them so as to keep variations in wavelength within 0.1 nm or, at least, as accurately as the control of the difference in wave-length.

By the way, another challenge encountered in an optical transmission system to which the WDM technique is applied is how to assure a stable operation when increasing or decreasing the number of channels in accordance with a change in required transmission capacity or in the event of a failure occurring in an apparatus. When adding a channel to a system employing LDs as transmitter light sources, for example, while the bias current of an LD is increasing to a predetermined value or the temperature of the LD is being stabilized to a set value during the rise time of the light source associated with the additional channel in a cold start thereof, the wavelength of the additional channel varies inevitably by about several nanometers. Also when halting a light source, a similar phenomenon is observed. In addition, when a failure occurs in part of the system or, in particular, when a failure occurs in an LD itself, the bias-current control circuit of the LD or a temperature control circuit, the wavelength may change suddenly. It is thus desirable to assure a stable operation on the transmitter side so that variations in wavelength occurring in a light source thereof do not affecting other light sources.

SUMMARY OF THE INVENTION

It is therefore a main object of the present invention to cope with variations in wavelength occurring on the transmitter side. Other objects of the present invention will become apparent from the following description.

According to one aspect of the present invention, there is provided an optical transmitter comprising: a light source; a band-pass filter for filtering a light generated by the light source; a light splitting means for splitting a light output by the band-pass filter into at least two split light; an optical receiving unit for converting one of the split lights into an electrical signal having a level proportional to the intensity of the split light; and a control means for controlling the wavelength of the light source so as to sustain the intensity of the split light at a fixed value.

According to another aspect of the present invention, there is provided an optical transmission system for transmission adopting a wavelength division multiplexing technique, the optical transmission system comprising: a plurality of optical transmitters each for outputting a signal light; and an optical multiplexer for multiplexing the signal lights generated by the optical transmitters and outputting a multiplexed light to one or more optical transmission lines, wherein each of the optical transmitters includes: a light source; a band-pass filter for filtering a light generated by the light source; a light splitting means for splitting a light output by the band-pass filter into at least two split lights; an optical receiving unit for converting one of the split lights into an electrical signal having a level proportional to the intensity of the split light; and a control means for controlling the wavelength of the light source so as to sustain the intensity of the split light at a fixed value, and wherein another one of the split lights is transmitted as the signal light.

According to a further aspect of the present invention, there is provided an optical-filter array of a space-division type comprising: a plurality of band-pass-filter elements having transmission-band center wavelengths different from each other; a plurality of input ports; a plurality of output ports corresponding to the input ports on a one-to-one basis; a transparent substrate provided in such a way that the transparent substrate is entangled with a plurality of optical paths created between the input ports and the output ports; and interference films placed one layer upon another on the transparent substrate with thicknesses thereof smoothly changing in an arranging direction of the optical paths in the optical-filter array.

The application of the optical-filter array provided by the present invention to an optical reception system will be described later.

In the optical transmitter and the optical transmission system provided by the present invention, an optical band-pass filter is used to serve as a wavelength reference for passing a light generated by a light source at a wavelength equal or close to a reference wavelength. The light source is controlled so as to adjust the wave-length thereof to the transmission wavelength (reference wavelength) of the optical band-pass filter. In this way, variations in wavelength occurring in the transmitter side can be coped with. The optical band-pass filter not only serves as a wavelength reference but also plays the role of a protection filter for avoiding effects of large variations in wavelength occurring in the light source on signal lights generated by other signal sources. As a result, it is not necessary to employ a means such as an optical switch for temporarily stopping the supplying of a light by a light source to a transmission line at the building-up stage of the light source.

In the optical transmission system provided by the present invention, each band-pass filter serves as a filter element of an optical-filter array of the transmission type having a plurality of input ports and as many corresponding output ports as the input ports, making it easy to keep the wavelength interval among channels at a fixed value.

The above and other objects, features and advantages of the present invention and the manner of realizing them will become more apparent and the present invention itself will be best understood from a study of the following description and appended claims with reference to attached drawings showing some preferred embodiments of the present invention.

DESCRIPTION OF THE PREFERRED DRAWINGS

The present invention will become more apparent from the following detailed description of preferred embodiments with reference to accompanying diagrams.

Figure 1:
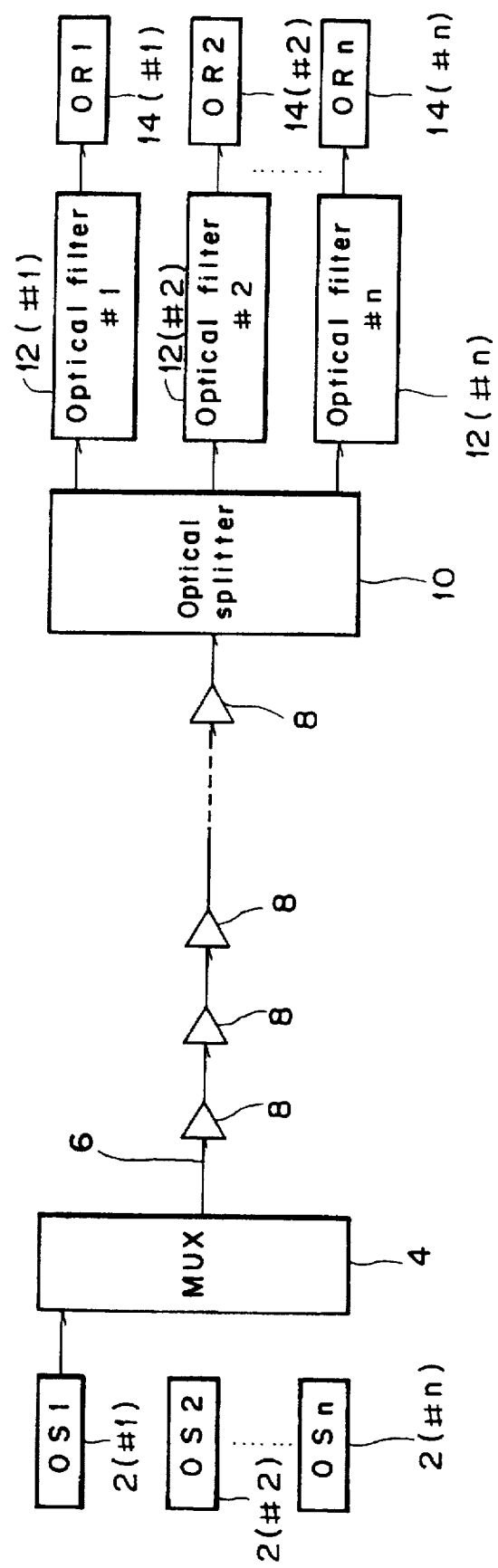
FIG. 1 is a block diagram of a WDM transmission system.

FIG. 1 is a block diagram of a WDM transmission system to which the present invention can be applied. As shown in the figure, signal lights output by a plurality of optical transmitters 2 (#1 to #n) having wavelengths set at values different from each other are multiplexed by an optical multiplexer 4 and transmitted to an optical transmission line 6. A plurality of optical repeaters 8 each having typically an EDFA are installed along the optical transmission line 6. The WDM signal light transmitted through the optical repeaters 8 is first split by an optical splitter 10 into a plurality of channels. Each split light is supplied to one of wavelength selecting filters 12 (#1 to #n). Then each filtered signal light is received by one of optical receivers 14 (#1 to #n).

Figure 2:
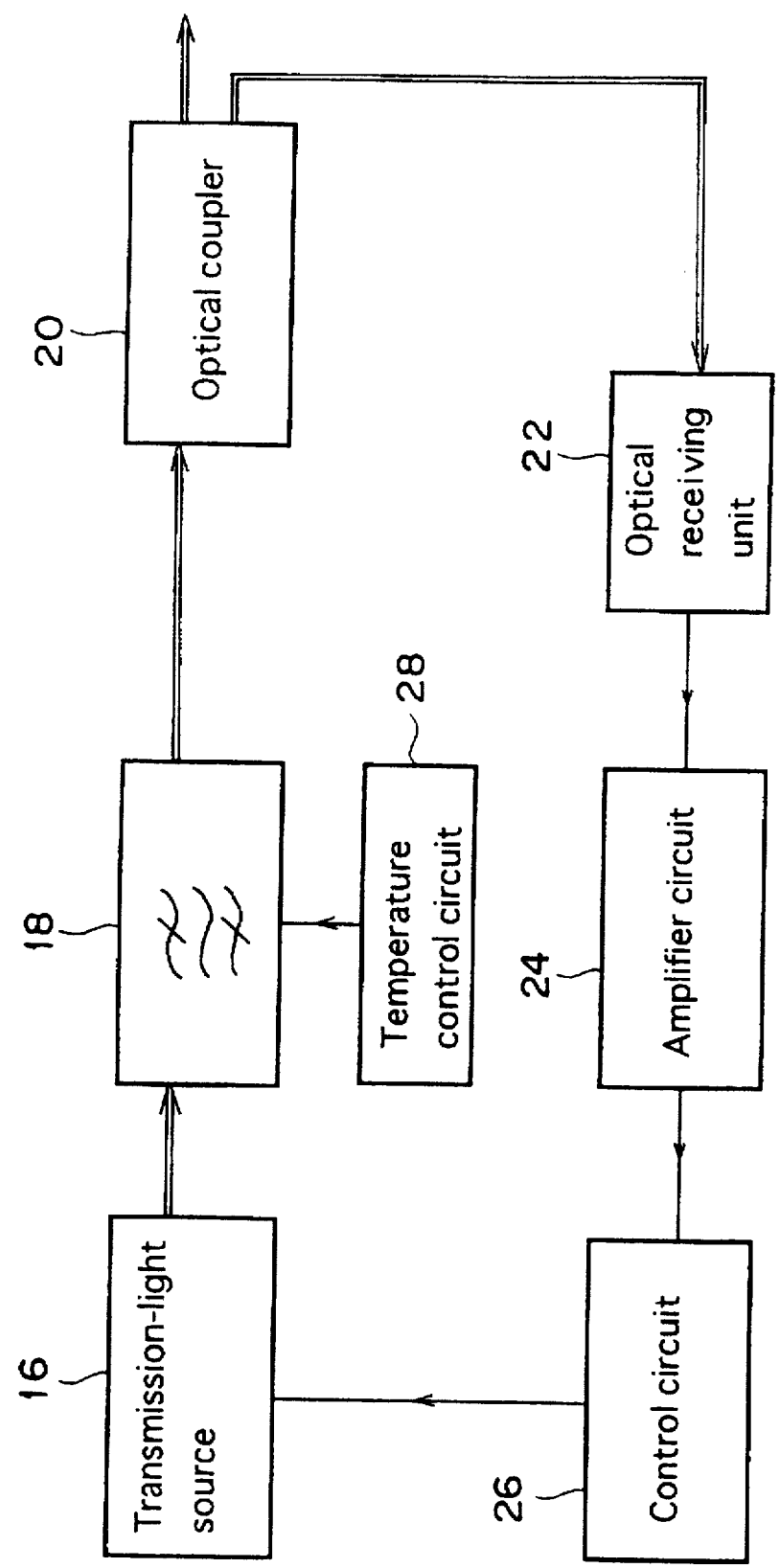
FIG. 2 is a block diagram showing the basic configuration of an optical transmitter.

FIG. 2 is a block diagram showing the basic configuration of an optical transmitter provided by the present invention which optical transmitter can be applied to the system shown in FIG. 1. As shown in the figure, the optical transmitter comprises a transmission-light source 16 typically including an LD and a circuit for driving the LD, a band-pass filter 18 for filtering a light radiated by the transmission-light source 16, an optical coupler 20 for splitting a light passing through the band-pass filter 18 into at least two split lights and an optical receiving unit 22 for converting one of the split lights into an electrical signal with a level representing the intensity of the split light. Typically, a photo diode is used as the optical receiving unit 22. The other split signal output by the optical coupler 20 is transmitted to an optical receiver through a transmission line which is not shown in the figure. The electrical signal output by the optical receiving unit 22 is amplified by an amplifier circuit 24 before being supplied to a control circuit 26. The control circuit 26 controls the wavelength of the transmission-light source 16 so that the intensities of the split lights output by the optical coupler 20 do not change.

The band-pass filter 18 typically has a narrow-band characteristic as far as the relation between the transmissivity and the wavelength is concerned. In order to preserve this characteristic, a temperature control circuit 28 is provided to keep the temperature of the band-pass filter 18 at a fixed value. An interference filter comprising layers of dielectric films placed one upon another or a filter of the bulk type using a grating or of the wave-guide type can be used as the band-pass filter 18. The aged deterioration of the interference filter is smaller than 0.1 nm, allowing sufficient stability to be obtained when adopting the WDM technique with a wavelength interval of about 1 nm described earlier. It should be noted that, if the required stability can be obtained without implementing temperature control, the temperature control circuit 28 is not required.

In this embodiment, the band-pass filter 18 serves as a wavelength reference. As a result, in a WDM system employing a plurality of such optical transmitters, the effect of a large variation in wavelength occurring in one of the transmission-light sources 16 on signal lights of other channels can be avoided. That is to say, the optical band-pass filter 18 not only serves as a wavelength reference but also plays the role of a protection filter. It is therefore not necessary to cut off a signal light using a device such as an optical switch or to carry out synchronization with other channels during the build-up stage at a cold-start of a particular optical transmitter.

Figure 3:
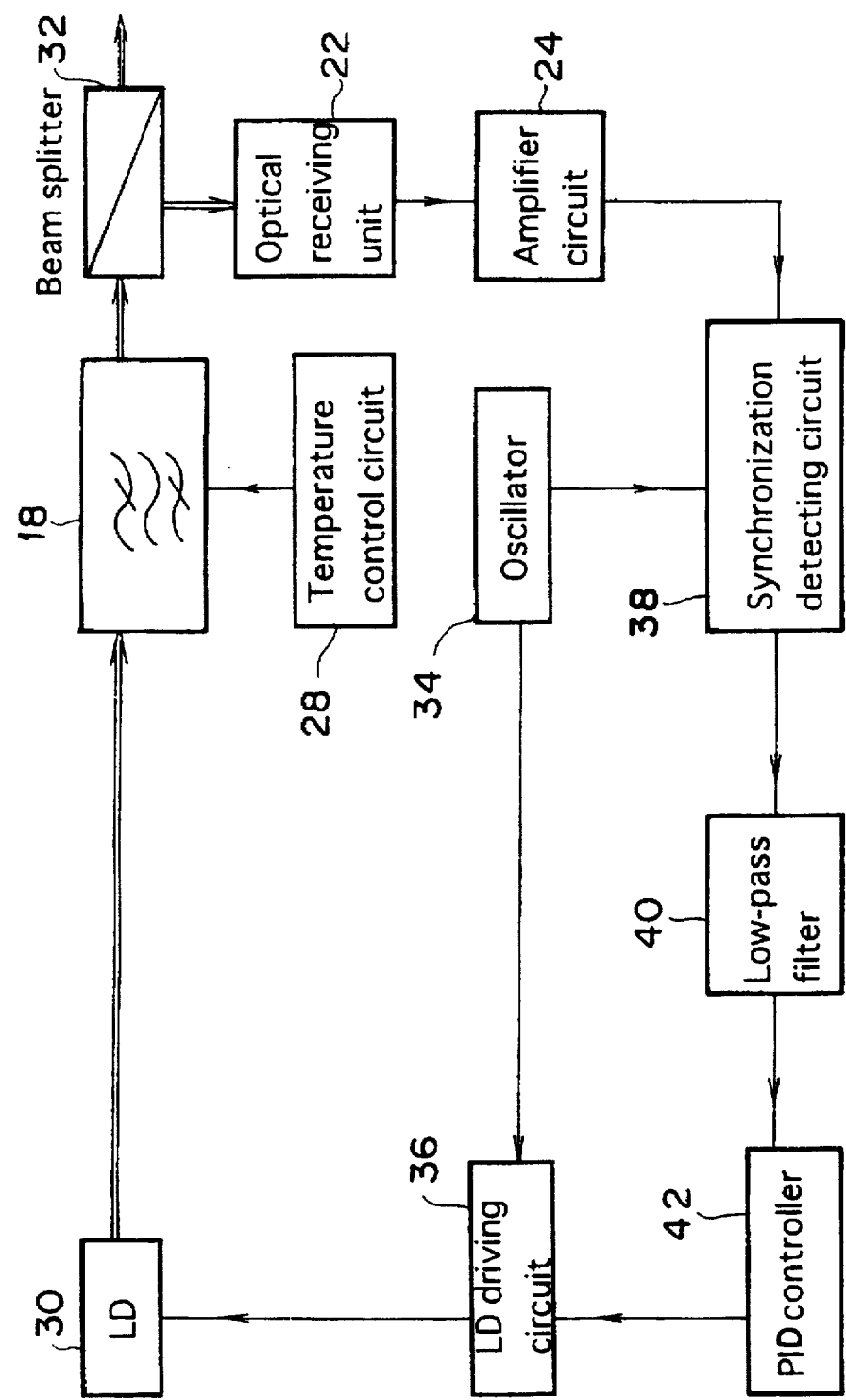
FIG. 3 is a block diagram showing a first embodiment of the optical transmitter.

FIG. 3 is a block diagram showing a first embodiment of the optical transmitter. In this embodiment, a laser diode 30 is employed as a transmission-light source. As shown in the figure, a light generated by the transmission-light source 30 passes through the band-pass filter 18 before being split by a beam splitter 32. One of split lights output by the beam splitter 32 is transmitted to an optical transmission line not shown in the figure whereas the other split light is supplied to the optical receiving unit 22. In this embodiment, receiving an electrical signal produced by the optical receiving unit 22, a control means controls the wavelength of the transmission-light source 30 so that the intensities of the split lights remain at a fixed value. The control means comprises an oscillator 34 for generating a low-frequency signal, a modulating means 36 for carrying out frequency modulation on the laser diode 30 at a low degree of modulation by using the low-frequency signal and a synchronization detecting means 38. Receiving the low-frequency signal generated by the oscillator 34 and the electrical signal produced by the optical receiving unit 22, the synchronization detecting means 38 detects low-frequency components included in the electrical signal. Control is then carried out so that the wavelength of the laser diode 30 matches a wavelength which provides a peak of the characteristic of the band-pass filter 18. The control is implemented in concrete terms as follows.

The low-frequency signal generated by the oscillator 34 is supplied to an LD driving circuit 36 and a synchronization detecting circuit 38. The LD driving circuit 36 carries out frequency modulation at a low degree of modulation on the laser diode 30 by means of the low-frequency signal generated by the oscillator 34. In addition to the low-frequency signal generated by the oscillator 34, the synchronization detecting circuit 38 also receives the electrical signal produced by the optical receiving unit 22 through the amplifier circuit 24. A signal output by the synchronization detecting circuit 38 is supplied to a PID controller 42 through a low-pass filter 40. In the following description, the signal supplied by the oscillator 34 to the synchronization detecting circuit 38 is referred to as "the low-frequency signal" whereas the signal supplied by the amplifier circuit 24 to the synchronization detecting circuit 38 is referred to as "the electrical signal". The synchronization detecting circuit 38 detects a difference in phase between the low-frequency signal and the electrical signal. The difference in phase is reflected in a DC signal output by the low-pass filter 40. Adopting the principle of the proportion-integration-differentiation control, the DC signal is used by the PID controller 42 to control the oscillation wavelength of the laser diode 30 so that the oscillation wavelength of the laser diode 30 matches a wavelength which provides a peak of the characteristic of the band-pass filter 18.

Figure 4B:
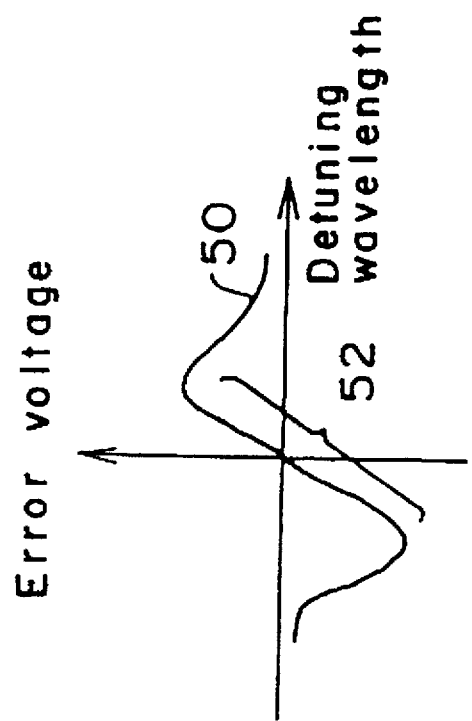
FIGS. 4A and 4B are diagrams used for explaining the principle of operation of a synchronization detector.
Figure 4A:
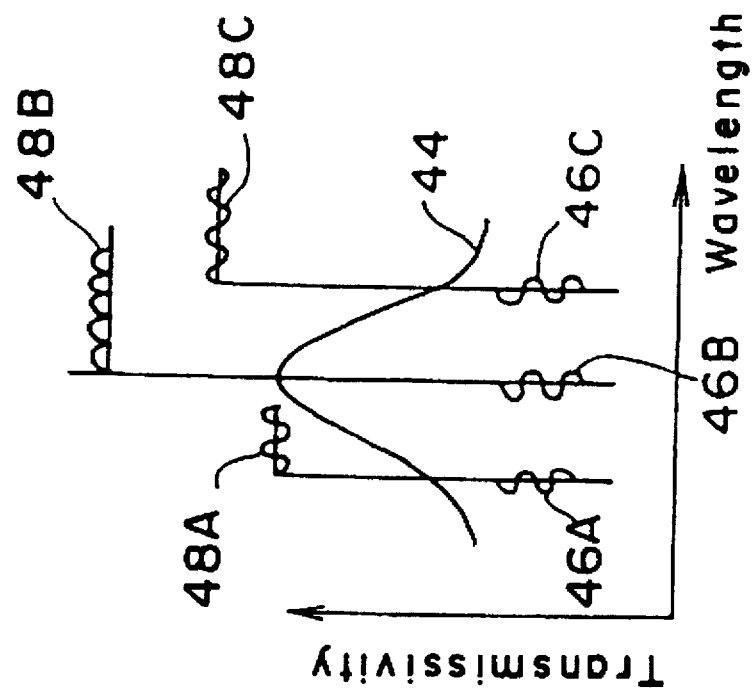

FIGS. 4A and 4B are diagrams used for explaining the principle of operation of the synchronization detecting circuit 38. FIG. 4A shows a characteristic curve representing a relation between the transmissivity and the wavelength of the band-pass filter 18. Reference numeral 44 is the characteristic curve of the band-pass filter 18. When the wavelength of the light generated by the laser diode 30 is smaller than the wavelength providing the peak of the characteristic curve 44, the laser diode 30 undergoes frequency modulation based on a low-frequency signal denoted by reference numeral 46A. In this case, the light output by the band-pass filter 18 is an intensity-modulated signal denoted by reference numeral 48A having the same phase as that of the low-frequency signal 46A. When the wavelength of the light generated by the laser diode 30 is greater than the wavelength providing the peak of the characteristic curve 44, on the other hand, the laser diode 30 undergoes frequency modulation based on a low-frequency signal denoted by reference numeral 46C. In this case, the light output by the band-pass filter 18 is an intensity-modulated signal denoted by reference numeral 48C having a phase opposite to that of the low-frequency signal 46C.

When the wavelength of the light generated by the laser diode 30 matches the peak wavelength, the wavelength providing the peak of the characteristic curve 44, the light output by the band-pass filter 18 contains no component of the low-frequency signal even if the laser diode 30 is frequency-modulated by the low-frequency signal. That is to say, in this case, the light output by the band-pass filter 18 is an intensity-modulated signal denoted by reference numeral 48B at a frequency twice that of the low-frequency signal. Accordingly, by extracting a component having the same frequency as the low-frequency signal out off the split light by means of the synchronization detecting circuit 38, frequency discrimination (or wavelength discrimination) can be carried out on the light generated by the laser diode 30.

FIG. 4B shows a relation between an error voltage (or the level of the DC signal output by the low-pass filter 40) and the detuning wavelength relative to the peak wavelength. According to the principle cited above, it is obvious that a characteristic denoted by reference numeral 50 is obtained as a differential of the characteristic curve 44 of the band-pass filter 18. The characteristic 50 shows that, when the wavelength of the light generated by the laser diode 30 is greater than the peak wavelength, the error voltage is positive. When the wavelength of the light generated by the laser diode 30 is smaller than the peak wavelength, on the other hand, the error voltage is negative and when the wavelength of the light generated by the laser diode 30 matches the peak wavelength, the error voltage is zero. Accordingly, by carrying out PID control based on a proportion segment 52 of the differential characteristic 50, the wavelength of the light generated by the laser diode 30 can be adjusted to match the peak wavelength of the characteristic curve 44 of the band-pass filter 18.

Figure 5:
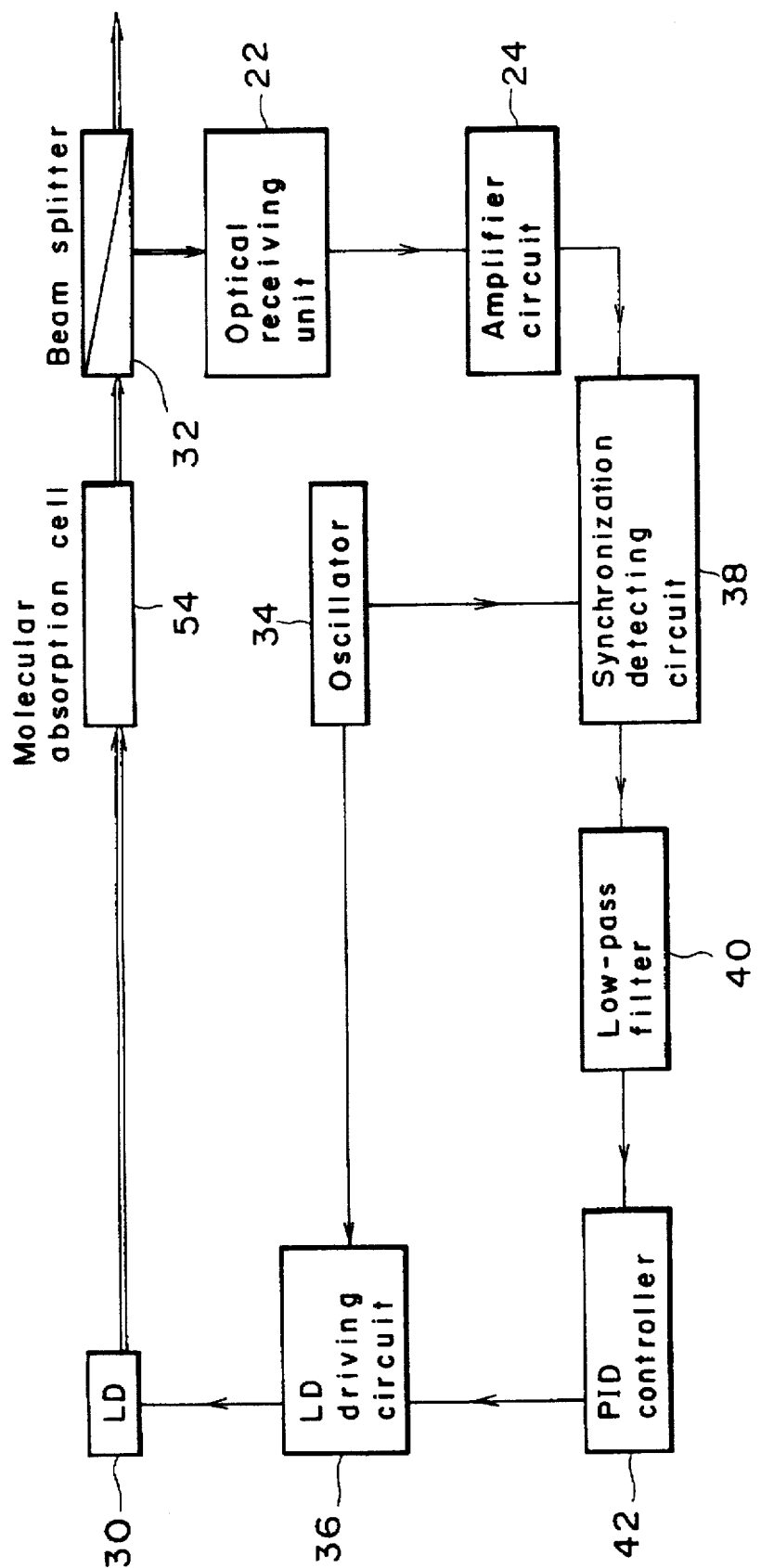
FIG. 5 is a block diagram showing a typical prior art optical transmitter.

In order to explain the superiority of the optical transmitter provided by the present invention, FIG. 5 is provided to show a block diagram of the prior art optical transmitter. In FIG. 5, components having identical functions with those shown in the previous figures are denoted by the same reference numerals as those used in the previous figures. In the case of the prior art optical transmitter, a molecular absorption cell 54 is employed to serve as a wavelength reference. The molecular absorption cell 54 is a vacuum transparent container enclosing gas such as HCN or $NH_3$ at an appropriate pressure. The molecular absorption cell 54 is placed on the optical path of a light output by the laser diode 30. Since the molecular absorption cell 54 slightly absorbs light with a wavelength corresponding to an intrinsic vibration frequency determined by the type of the gas enclosed therein, it has a characteristic curve having an upside-down shape when compared to the characteristic curve shown in FIG. 4A. Therefore, according to the principle of the synchronization detection described earlier, it is possible to adjust the wavelength of the light output by the laser diode 30 so as to match the absorption wavelength of the molecular absorption cell 54.

In this prior art optical transmitter, however, a means for cutting off the supply of the light generated by the laser diode 30 to the optical transmission line is not provided. As a result, when the prior art optical transmitter is applied to a WDM transmission system, the effect of a large change in wavelength of the light generated by the laser diode during, for example, a cold start of the optical transmitter or in the event of a failure occurring in its control circuit on other channels can not be avoided.

In the case of the optical transmitter provided by the present invention, on the other hand, a band-pass filter is employed to serve as a wavelength reference. In the embodiment shown in FIG. 3, in particular, a band-pass filter having a narrow band is used. For this reason, a light generated by the transmission-light source with its wavelength varying greatly can not pass through the band-pass filter. As a result, when the optical transmitter is applied to a WDM system, there is no effect of the variations in wavelength on other channels.

By the way, in the case of an optical transmitter applied to a trunk system, charping in wavelength occurring in the intensity modulation are suppressed to tailor the optical transmitter to high-speed transmission. Accordingly, external modulation is generally adopted. An optical modulator of the Mach-Zehnder type using lithium niobate (LiNbO$_3$) as a substrate material is put to practical use as an external modulator. In an optical modulator of this type, a low-frequency signal is superimposed on a DC bias supplied to the optical modulator. A light output by the optical modulator is split and a split light is received for synchronization detection. Control based on the synchronization detection (called the ABC which stands for Automatic Bias Control) is carried out to stabilize the operating point of the optical modulation. In addition, in the optical transmitter, control known as APC (Automatic Power Control) is also performed as well for stabilizing the optical output thereof. It should be noted that, the control for stabilizing the wavelength described above is referred to as the AFC (Automatic Frequency Control).

Figure 6:
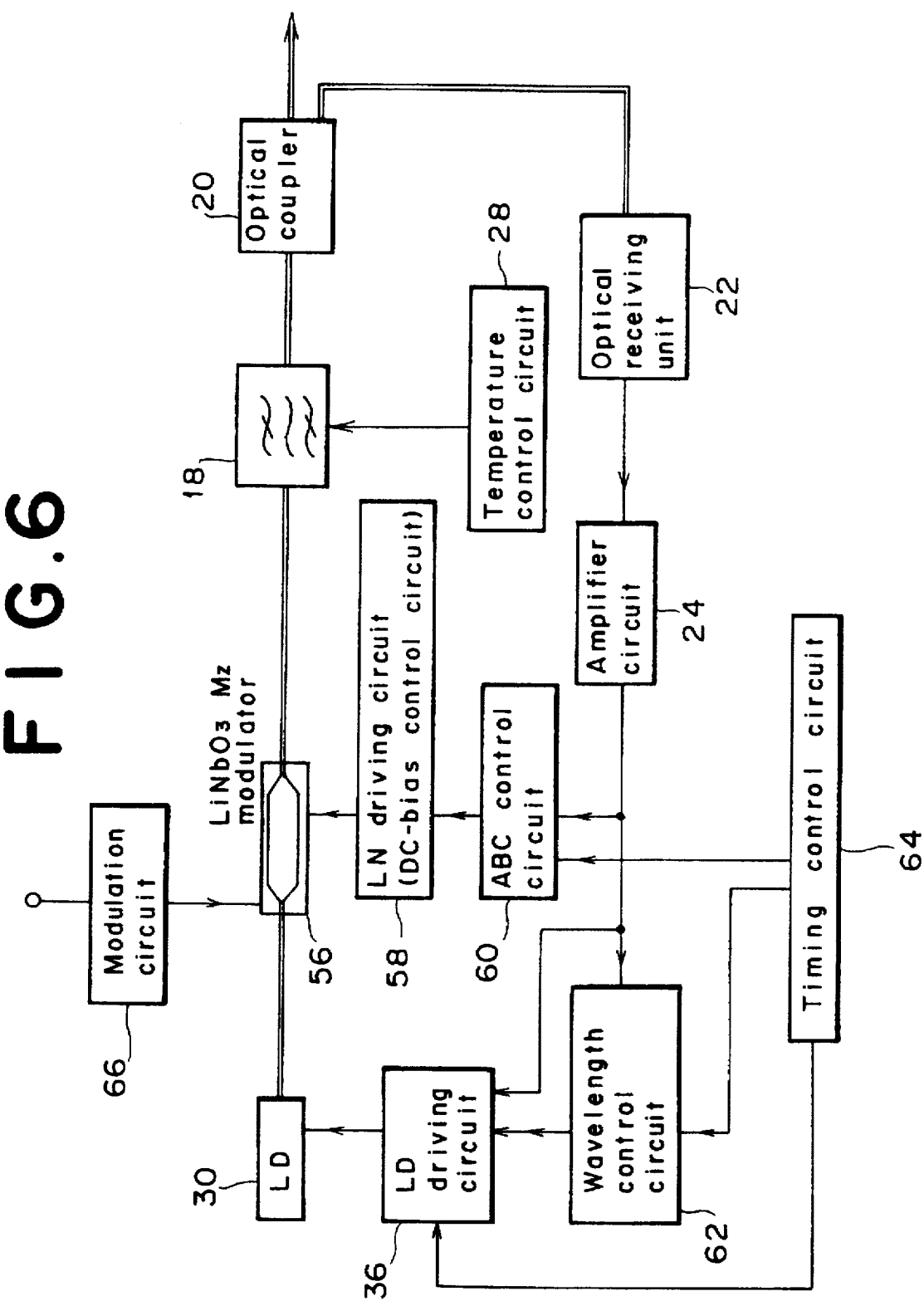
FIG. 6 is a block diagram showing a second embodiment of the optical transmitter.

An embodiment implementing an optical transmitter adopting the external-modulation technique wherein the ABC, the APC and the AFC are carried out is described by referring to FIG. 6 as follows. FIG. 6 is a block diagram showing a second embodiment of the optical transmitter provided by the present invention. In the case of the embodiment described so far, the laser diode which serves as a transmission-light source is directly modulated by a driving circuit. In the second embodiment, on the other hand, the laser diode 30 outputs a light with a constant intensity which light then undergoes intensity modulation at an external optical modulator 56. Typically, the optical modulator 56 is an optical modulator of the Mach-Zehnder type using lithium niobate (LiNbO$_3$ or LN) as a substrate material of the wave guide. The optical modulator 56 receives a modulation signal based on transmission data and a bias voltage for controlling its operating point. After completing the intensity modulation at the optical modulator 56, the light is supplied to the optical coupler 20 through the band-pass filter 18. At the optical coupler 20, the light is split. One of the split lights is output to a transmission line which is not shown in the figure. The other split light is supplied to the optical receiving unit 22 to be converted into an electrical signal. The modulation signal mentioned above is generated by a modulation circuit 66. The electrical signal output by the optical receiving unit 22 is amplified by the amplifier circuit 24 before being supplied to an ABC control circuit 60, the LD driving circuit 36 and a wavelength control circuit 62. Based on a signal output by the ABC control circuit 60, an LN driving circuit 58 supplies a controlled bias voltage to the optical modulator 56. The wavelength control circuit 62 which is provided for AFC purposes includes a synchronization detecting circuit, a low-pass filter and a PDI controller.

The LD driving circuit 36 controls the bias current of the laser diode 30 in accordance with a signal output by the wavelength control circuit 62. In this embodiment, the electrical signal output by the optical receiving unit 22 and then amplified by the amplifier circuit 24 is also directly supplied to the LD driving circuit 36 for accomplishing the APC. Since synchronization detection is carried out in the ABC and the AFC, common circuits for the synchronization detection can be used. For example, the optical coupler 20, the optical receiving unit 22 and the amplifier circuit 24 are common to the ABC and the AFC. By making the frequency of the low-frequency signal for the synchronization detection in the ABC different from that for the AFC, both the controls can be carried out independently of each other. It should be noted that, in this embodiment, a timing control circuit 64 is employed for implementing the ABC, AFC and APC on a time-division basis, allowing a common low-frequency oscillator to be used.

In the embodiment shown in FIG. 6, the light generated by the laser diode 30 is modulated by the optical modulator 56 and then the modulated light passes through the band-pass filter 18. It is worth noting, however, that a modulated signal having a wide spectrum due to the modulation can have the side portions of its spectrum filtered off by a narrow-band band-pass filter 18. In this case, there is some fear of the code error rate increasing during the demodulation. In such a case, modulation by the optical modulator can be carried out after the light generated by the laser diode 30 has passed through the band-pass filter 18. In the case of such post-filtering modulation, the components constituting the optical transmitter are arranged in an order starting with the laser diode 30 to be followed by the band-pass filter 18 and then the optical modulator 56 and ending with the optical coupler 20 which order is, however, not shown in the figure.

Figure 7:
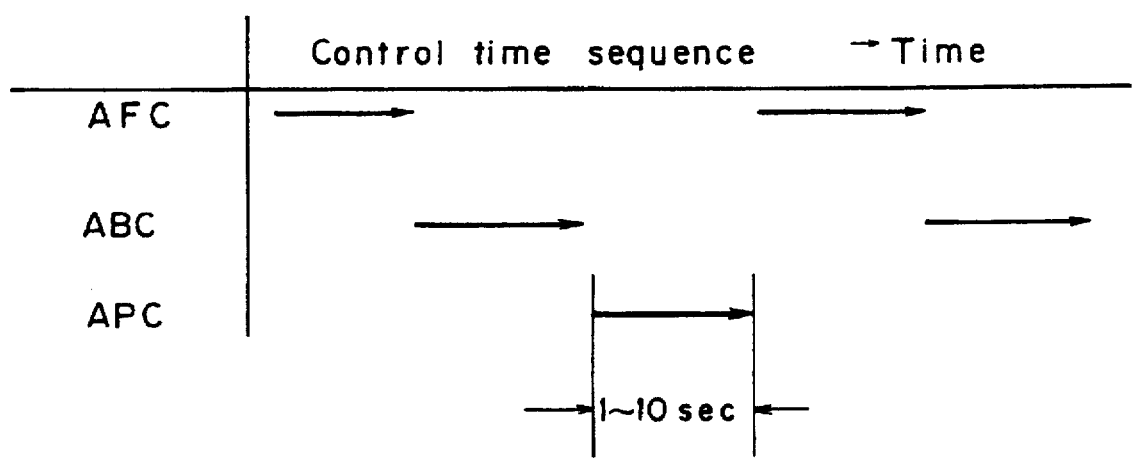
FIG. 7 shows timing charts of time-division control.

FIG. 7 shows typical timing charts of the time-division control. In this embodiment, the timing control circuit 64 switches the controls from one to another in the following order: the AFC to the ABC and then to the APC. The switching from one control to another allows a control circuit common to the AFC, the ABC and the APC to be used. The time slice allocated to each of the controls is typically 1 to 10 seconds.

Figure 8:
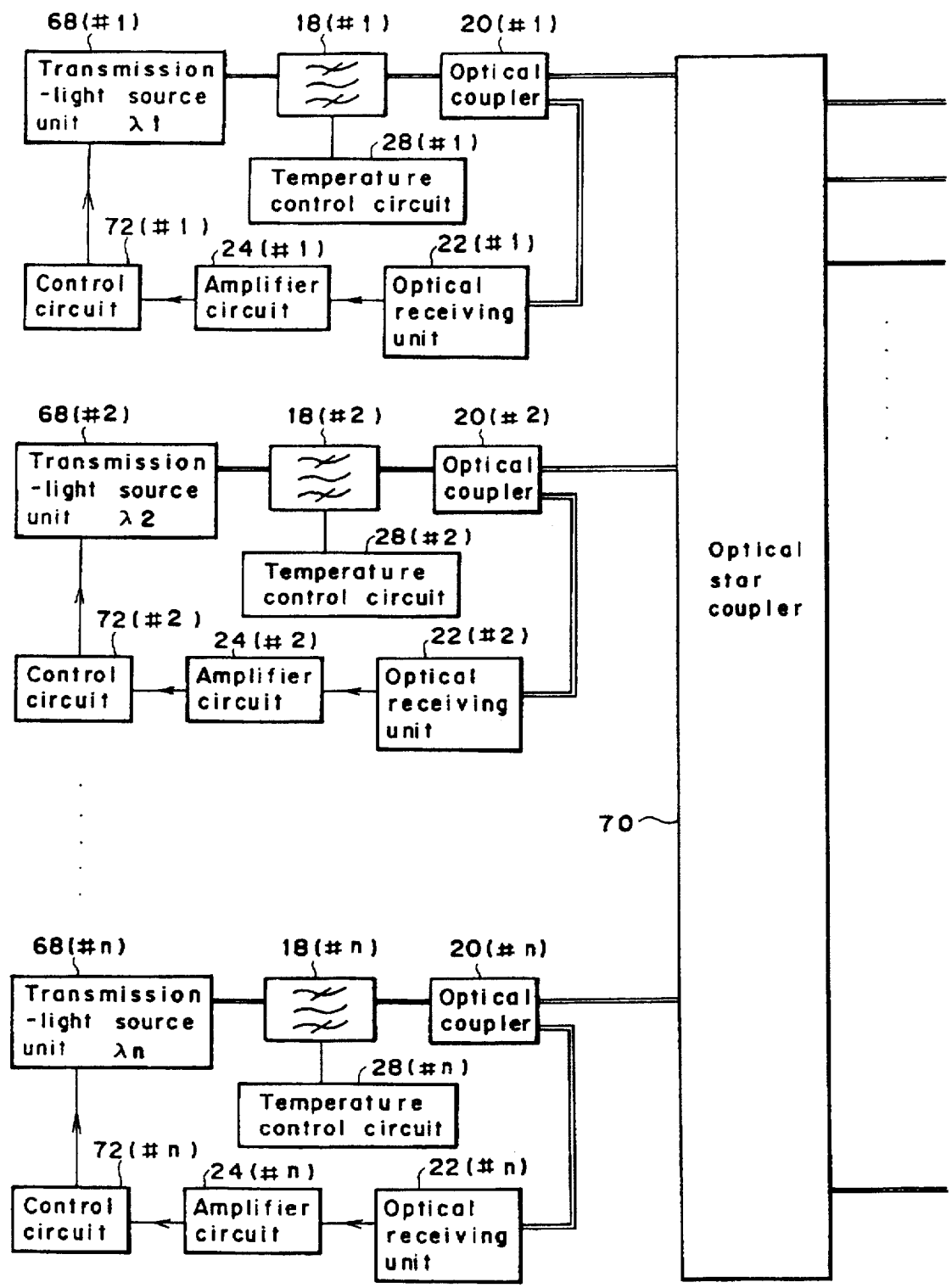
FIG. 8 is a block diagram showing a first embodiment of an optical transmission system.

Next, some embodiments implementing an optical transmission system in accordance with the present invention are described. FIG. 8 is a block diagram showing a first embodiment of an optical transmission system. As shown in the figure, the optical transmission system has a plurality of optical transmitters provided by the present invention, each of which optical transmitters is used for outputting a signal light. The signal lights output by the optical transmitters are multiplexed by means of an optical multiplexer to be output to one or more transmission lines. In this embodiment, an optical star coupler 70 is used as the optical multiplexer. The optical transmitters are each equipped with a transmission-light source unit 68. Thus, there are as many transmission-light source units 68 (#1 to #n) as the optical transmitters which transmission-light source units 68 (#1 to #n) are used for generating signal lights having wavelengths $\lambda_1$ to $\lambda_n$ different from each other. Each of the transmission-light source units 68 (#1 to #n) includes a directly modulated laser diode or a combination of a laser diode for outputting a light with a constant intensity and an external modulator.

Each of the optical transmitters comprises a band-pass filter 18, an optical coupler 20, an optical receiving unit 22, an amplifier circuit 24 and a temperature control circuit 28. Accordingly, there are as many band-pass filters 18 (#1 to #n), as many optical couplers 20 (#1 to #n), as many optical receiving units 22 (#1 to #n), as many amplifier circuits 24 and as many temperature control circuits 28 (#1 to #n) as the optical transmitters. Receiving an electrical signal from one of the optical transmitters, each of control circuits 72 (#1 to #n) carries out the AFC of the transmission-light source unit associated therewith. In the case of a transmission-light source unit having an external modulator, each of the control circuits 72 (#1 to #n) also includes a circuit for performing the ABC. The control circuits 72 (#1 to #n) can each be designed to also include an APC function as well. In this optical transmission system, the transmission-light source units are each assigned one of the wavelengths $\lambda_1$ to $\lambda_n$ which are different from each other, allowing the optical transmission system to be applied to an WDM system as it is.

By the way, in the embodiment shown in FIG. 8, the band-pass filters are provided for the optical transmitters independently of each other. In the case of a band-pass filter each employed to serve as a wavelength reference, a scheme wherein a plurality of distinct references are provided by the band-pass filters is not desirable. In the case of band-pass filters each having a characteristic dependent upon the temperature, for example, large variations in ambient temperature of the band-pass filters will make it within quite the bounds of possibility that the sustained accuracy of the intervals among the wavelengths deteriorates. In order to solve this problem, filter-array elements are employed as substitutes for the band-pass filters in the next embodiment. The filter elements constitute an optical-filter array of the space-division type which optical-filter array has a plurality of input ports and as many output ports as the input ports wherein the output ports correspond to the input ports in a one-to-one basis.

Figure 9:
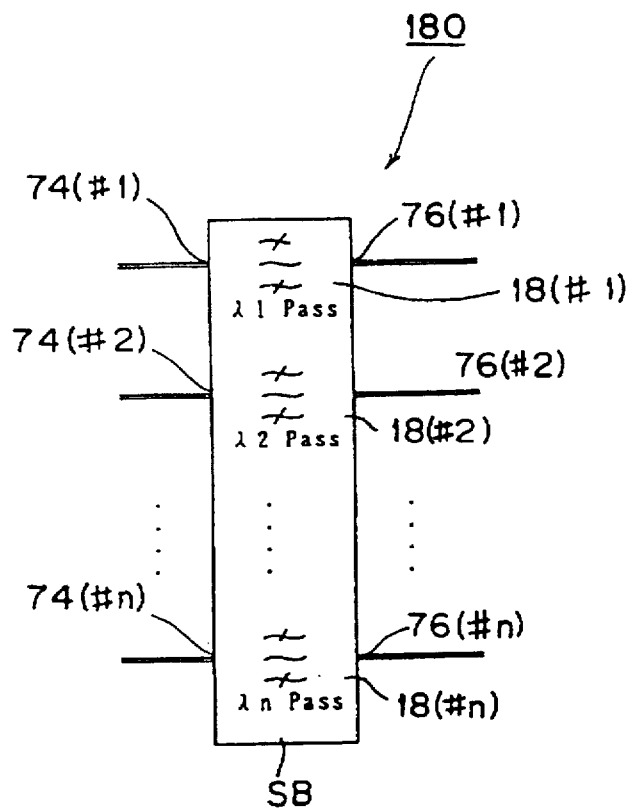
FIG. 9 is a diagram showing an optical-filter array of the space-division type.

FIG. 9 is a view showing the optical-filter array 180 of the space-division type. This optical-filter array 180 has a single substrate SB on which, band-pass filter elements 18 (#1 to #n) having transmission-band center wavelengths $\lambda_1$ to $\lambda_n$ are created. Reference numeral 74 denotes the input ports (#1 to #n) whereas reference numeral 76 denotes the output ports (#1 to #n) of the band-pass filter elements 18 (#1 to #n).

Figure 10:
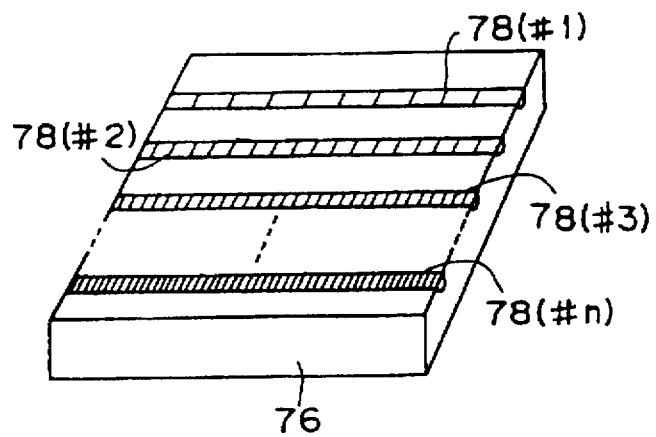
FIG. 10 is a perspective view of a first embodiment of the optical-filter array.

Embodiments of the optical-filter array of the space-division type are described by referring to FIGS. 10 to 13. FIG. 10 is a view showing a first embodiment of the optical-filter array. As shown in the figure, the optical-filter array comprises a wave-guide substrate 76, and a plurality of wave-guide diffraction lattices 78 (#1 to #n) having lattice constants different from each other which are formed on the wave-guide substrate 76. The ends of each of the wave-guide diffraction lattices 78 (#1 to #n) serve as the input and output ports of the optical-filter array.

Figure 11:
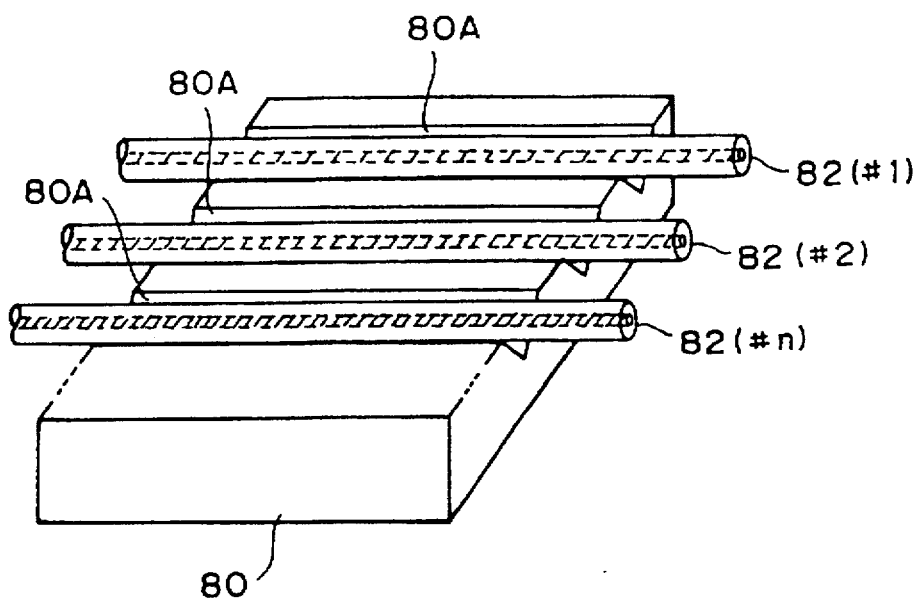
FIG. 11 is a perspective view of a second embodiment of the optical-filter array.

FIG. 11 is a view showing a second embodiment of the optical-filter array. As shown in the figure, the optical-filter array comprises a substrate 80 having a plurality of V grooves 80A and a plurality of optical filters 82 (#1 to #n) of the fiber-grating type. The optical filters 82 are each seated on one of the V grooves 80A and have lattice constants different from each other. In this embodiment, the V grooves 80A are created in parallel to each other in order to simplify the work to assemble the device and make other processes simple. The ends of the fiber-grating optical filters 82 (#1 to #n) serve as the input and output ports of the optical-filter array.

Figure 12:
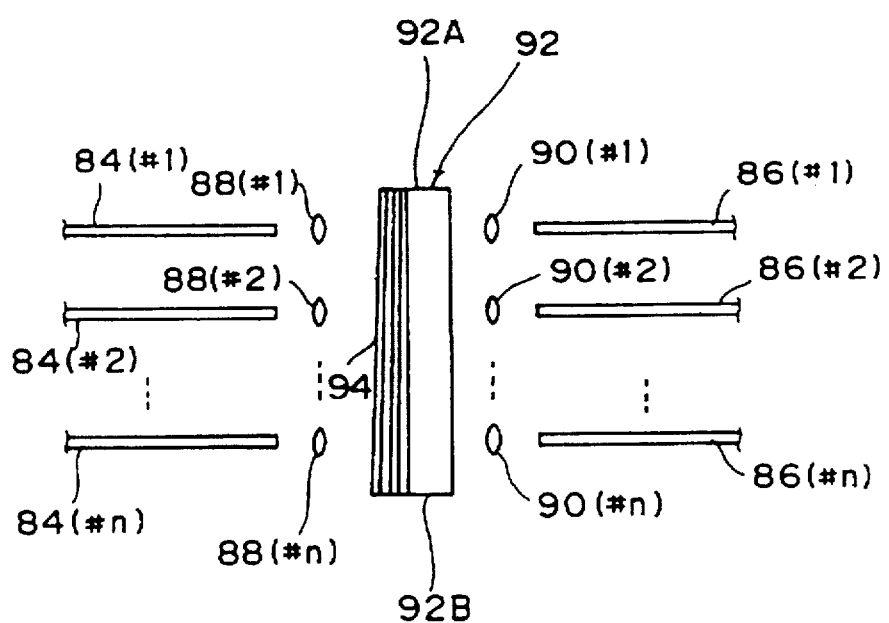
FIG. 12 is a plan view of a third embodiment of the optical-filter array.

FIG. 12 is a plan view of a third embodiment of the optical-filter array. As shown in the figure, the input ports of this optical-filter array are a plurality of input-side optical fibers 84 (#1 to #n) which are placed in parallel to each other. Similarly, the output ports of this optical-filter array are a plurality of output-side optical fibers 86 (#1 to #n) which are placed in parallel to each other. The output-side optical fibers 86 correspond to the input-side optical fibers 84 on a one-to-one basis. In order to create optical paths for parallel optical beams between the input and output ports, a lens 88 is provided in close proximity to the exciting end of each of the input-side optical fibers 84 and, likewise, a lens 90 is provided in close proximity to the exciting end of each of the output-side optical fibers 86. Thus, there are as many lenses 88 (#1 to #n) as the input-side optical fibers 84 (#1 to #n) and as many lenses 90 (#1 to #n) as the output-side optical fibers 86 (#1 to #n). Reference numeral 92 is a transparent substrate provided in such a way that the transparent substrate 92 is entangled with the optical paths. Typically, the transparent substrate 92 is parallel glass plates.

Interference films 94 are created on the transparent substrate 92. The thicknesses of the interference films 94 vary smoothly in the arranging direction of the optical paths in the optical-filter array. Typically, the interference films 94 are a plurality of dielectric layers placed one upon another. Each of the dielectric layers is made of $TiO_2$ having a high refraction index or $SiO_2$ with a low refraction index. The layers with high and low refraction indexes are placed one upon another alternately. The interference films 94 are typically created by using the vapor-deposition technique. In this case, in order to create the interference films 94 having their thicknesses varying smoothly as described above, the distance from the vapor depositing source to one end 92A of the transparent substrate 92 is made different from the distance from the vapor depositing source to the other end 92B of the transparent substrate 92. That is to say, the transparent substrate 92 is accommodated in a vapor depositing apparatus in a slanting posture. The reason why the thicknesses of the interference films are made vary smoothly is to have transmission-band center wavelengths of the optical-filter elements differing from each other.

Merits of using a band-pass-filter array of the space-division type described above are listed as follows:

(1) Since the filter elements are created on a single substrate, any existing temperature variation can be controlled in a uniform manner, making it sufficient to employ only one control circuit. As a result, the stability is improved.

(2) By creating portions determining characteristics of filter elements from the same material on the same substrate as in the case with the embodiments shown in FIGS. 10 and 12, any aged variation in transmission-band center wavelength causes a tendency of the filter elements to vary within the same range and in the same direction. As a result, even if the absolute values of the transmission-band center wavelengths vary, the relation among the wavelengths such as the wavelength interval remains all but unchanged.

(3) By arranging optical filters into an array, compact and low-cost band-pass filters can be implemented in comparison with band-pass filters manufactured individually.

Figure 13:
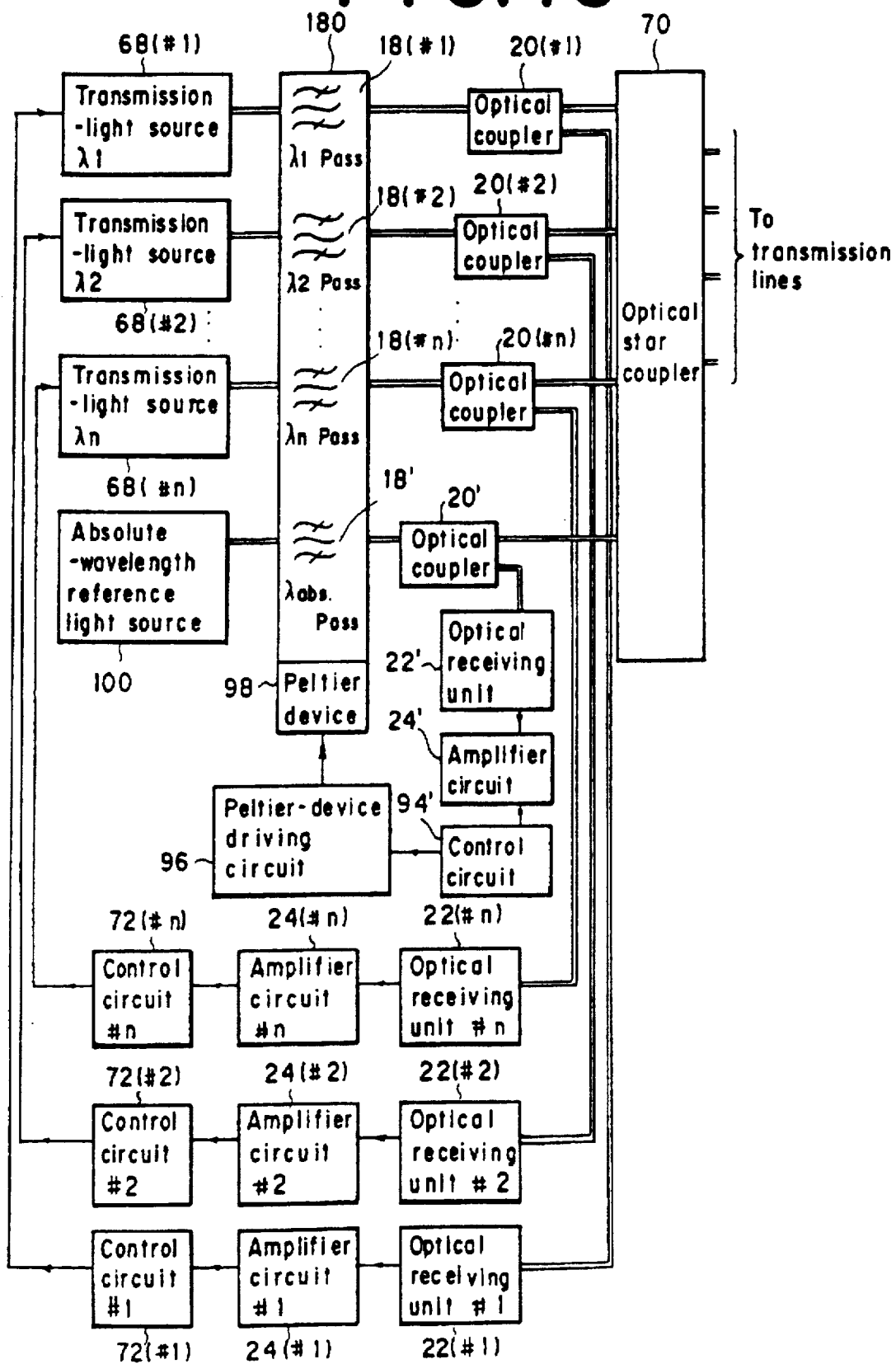
FIG. 13 is a block diagram showing a second embodiment of the optical transmission system.

FIG. 13 is a block diagram showing a second embodiment of the optical transmission system provided by the present invention. Unlike the first embodiment shown in FIG. 8, this second embodiment is characterized in that a band-pass optical-filter array 180 of the space-division type serves as wavelength references of the transmission-light source units 68 (#1 to #n). In addition, the optical-filter array 180 has another filter element 18' beside ordinary filter elements 18 (#1 to #n) for the transmission-light source units 68 in order to stabilize the absolute values of the wavelengths. The filter element 18' is a band-pass filter with the transmission-band center wavelength $\lambda$ abs. The input port of the filter element 18' is connected to an absolute-wavelength reference light source 100 whereas the output port thereof is connected to an optical coupler 20'. One of split lights output by the optical coupler 20' is supplied to a transmission line not shown in the figure through the optical star coupler 70 while the other split light is supplied to an optical receiving unit 22' to be converted thereby into an electrical signal. The electrical signal resulting from the conversion is amplified by an amplifier circuit 24' before being supplied to a control circuit 94.

A Peltier device 98, an electronic cooling device, is attached to the filter-element array 180. The Peltier device 98 is driven by a driving circuit 96 to control the absorption and radiation of heat by the Peltier device 98 in accordance with a signal supplied by the control circuit 94 to the driving circuit 96. By controlling the absorption and radiation of heat, the transmission-band center wavelength of the filter element 18' can be locked to the absolute-wavelength reference light source 100. It should be noted that the control circuits 72 (#1 to #n) for the transmission light source units can be used in conjunction with a similar synchronization detecting circuit as the control circuit 94. According to a document written by Takahashi et al. with the title "The Wavelength Temperature Stability of a Narrow-Band Band-Pass Filter by Ion Assist", presented to a spring conference of the Academic Society of Electronic, Information and Communication Engineers, 1994, C-280, by properly selecting the coefficient of thermal expansion of a substrate material used for the interference filter, the dependence of the transmission wavelength on the temperature can be suppressed. As a result, the required wavelength stability can be obtained even without carrying out strict temperature control for the optical-filter array.

On the contrary, by appropriately selecting a coefficient of thermal expansion which deliberately increases the dependence of the wavelength on the temperature, the transmission wavelength can be controlled by changing the temperature of the optical-filter array. According to the document cited above, with the coefficient of thermal expansion of the substrate material set to approximately zero, for example, the dependence of the transmission-band center wavelength on the temperature is 0.015 nm/C. Accordingly, for a variation in temperature of 20 degrees Celsius, the wavelength can be changed by 0.3 nm. This value is sufficient for tuning an absolute-wavelength reference optical filter. To obtain a coefficient of thermal expansion of about zero for the substrate material, a quartz ($0.4 \times 10^{-7}$) material can be used.

Figure 14:
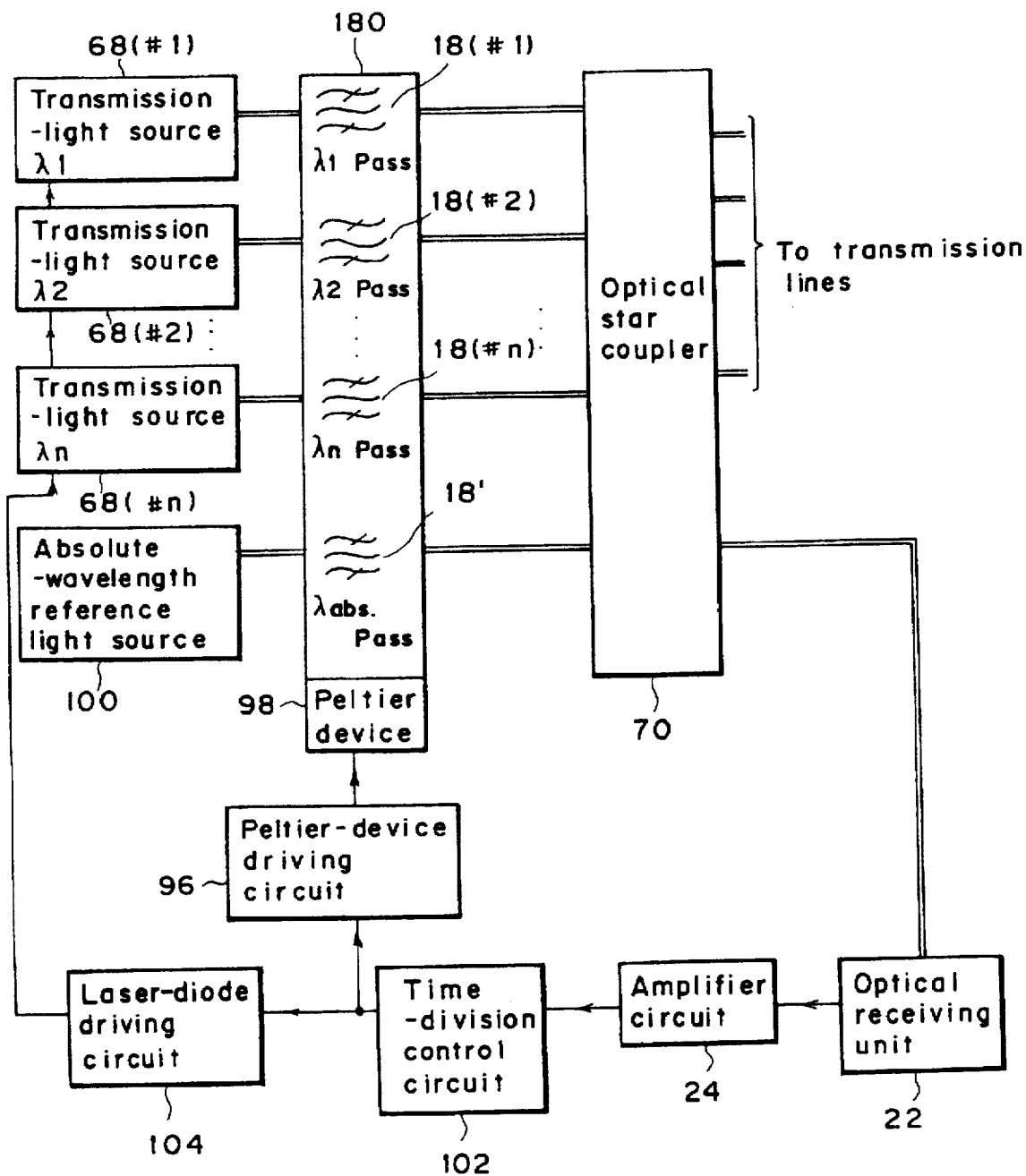
FIG. 14 is a block diagram showing a third embodiment of the optical transmission system.

FIG. 14 is a block diagram showing a third embodiment of the optical transmission system. In this embodiment, the function to split a light by means of an optical coupler in each of the transmission-light source unit is eliminated. Instead, a signal light is extracted from a light resulting from the multiplexing of signal lights generated by the transmission-light source units at the optical star coupler 70 and the extracted signal light is then converted into an electrical signal by the optical receiving unit 22. Since the detection is carried out after all the signal lights have been multiplexed, it is necessary to recognize the transmission-light source units individually. In this embodiment, the recognition is done by a time-division control circuit 102. Receiving the electrical signal produced by the optical receiving unit 22 and then amplified by the amplifier circuit 24, the time-division circuit 102 switches on a time-division basis from a Peltier-device driving circuit 96 for controlling the absolute-wavelength reference light source to a laser-diode driving circuit 104 for driving the transmission-light source units and vice versa. It should be noted that, instead of the time-division control, different low-frequency signals for synchronization detection can be assigned to the transmission-light source units and the absolute-wavelength reference light source.

Figure 15:
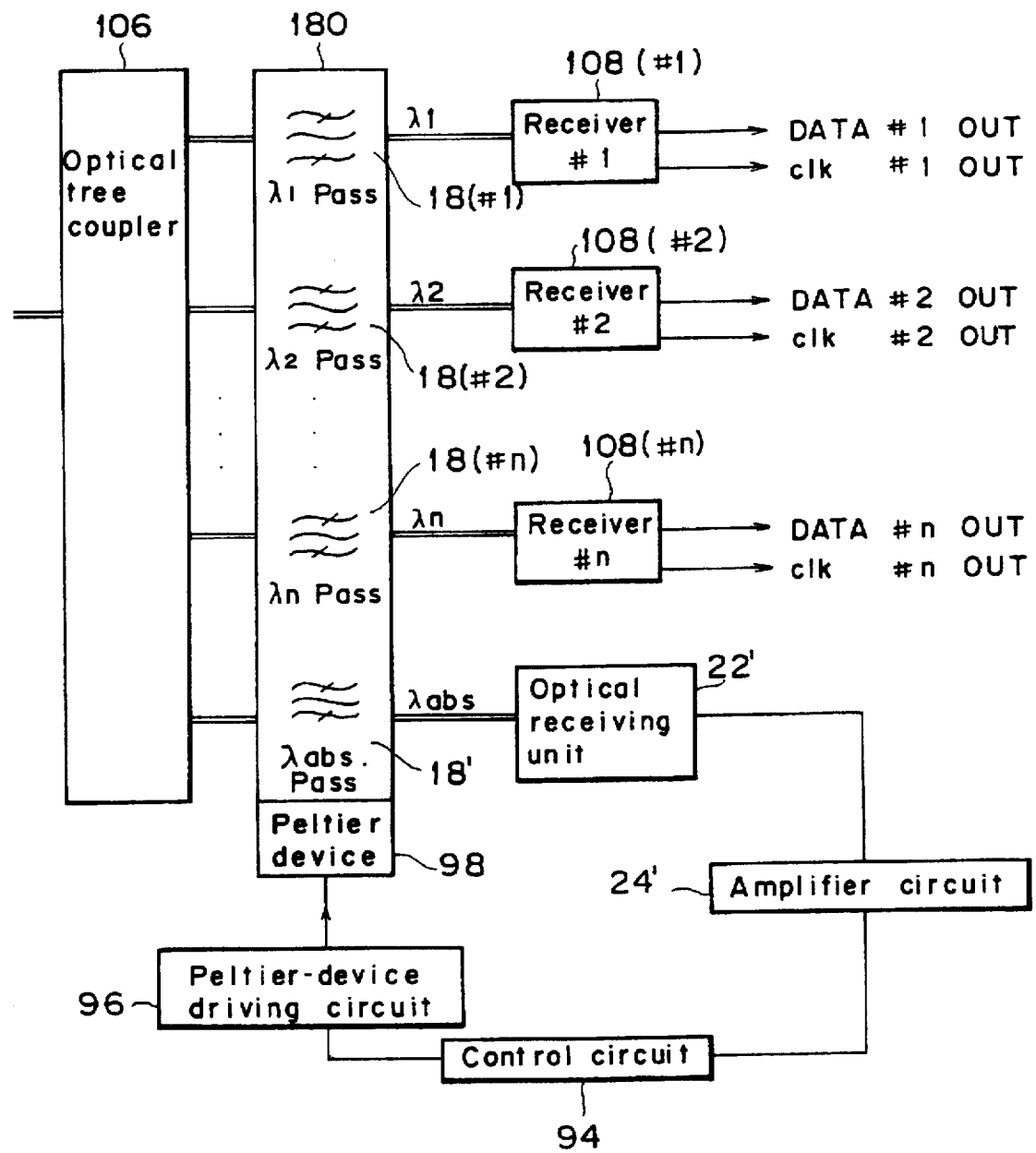
FIG. 15 is a block diagram showing a first embodiment of an optical reception system.

The optical-filter array and the control circuit shown in FIG. 13 can also be applied to the reception side as shown in FIG. 15. FIG. 15 is a block diagram showing a first embodiment of an optical reception system. As shown in the figure, a signal light supplied by an optical transmission line not shown in the figure is distributed by an optical tree coupler 106 to the input ports of the optical-filter array 180. The output ports of the optical-filter array 180 are each connected to an optical receiver 108. There are as many optical receivers 108 (#1 to #n) as the output ports which optical receivers 108 are used for receiving signal lights with wavelengths $\lambda_1$ to $\lambda_n$. In addition, the optical receiving unit 22' connected to the output port of the filter element 18' is used for receiving a light transmitted by the absolute-wavelength reference light source 100 shown in FIG. 13. The optical receivers 108 (#1 to #n) output data and clocks for channels #1 to #n. A signal output by the optical receiving unit 22' is amplified by the amplifier circuit 24' before being supplied to the control circuit 94. The Peltier-device driving circuit 96 controls the Peltier device 98 in accordance with a signal output by the control circuit 94.

Much like the embodiment shown in FIG. 13, this embodiment allows the transmission-band center wavelength of the filter element 18' to follow the wavelength of the absolute-wavelength reference light source 100 shown in FIG. 13. As a result, a stable reception operation can be carried out in each channel. In this embodiment, the filter element 18' corresponds to the absolute-wavelength reference light source 100. It should be noted that the filter element 18' can be made associated with one of the transmission-light source units.

Next, an embodiment of an optical transmitter that can stabilize the wavelength without resorting to synchronization detection is explained. In this embodiment, an optical filter of the space-division type is used for stabilize wavelengths.

Figure 16:
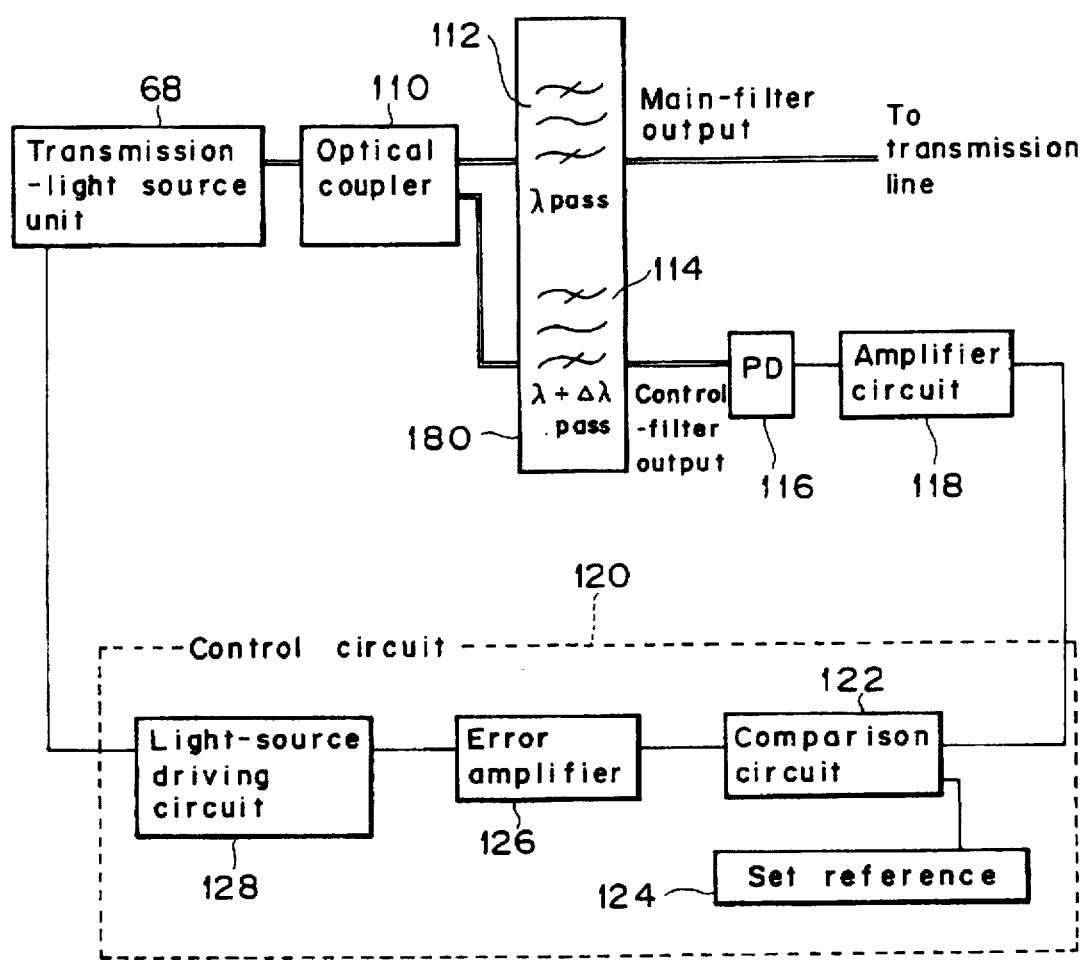
FIG. 16 is a block diagram showing a third embodiment of the optical transmitter.

FIG. 16 is a block diagram showing a third embodiment of the optical transmitter. A signal light generated by the transmission-light source unit 68 is split by an optical coupler 110 into two lights supplied to two input ports of the optical-filter array 180. One of two filter elements of the optical-filter array 180 is a main filter element 112 connected to the transmission line. The other is a filter element 114 for control use. The transmission-band center wavelength of the main filter element 112 is equal to the set wavelength $\lambda$ of the transmission-light source unit 68. On the other hand, the transmission-band center wavelength of the other filter element 114 is set at $\lambda + \Delta\lambda$, a value deviating slightly from the wavelength $\lambda$. $\Delta\lambda$ is set at a value about equal to the half width at half maximum of the characteristics of the filter elements 112 and 114. That is to say, the transmission-band center wavelengths of the filter elements 112 and 114 are set at $\lambda$ and $\lambda + \Delta\lambda$ respectively so that, when a light generated by the transmission-light source unit 68 passes through the main filter element 112 at the maximum transmissivity, only 50% of the maximum power of a light arriving at the control filter element 114 is passed on by it. This state is shown in FIG. 17.

Figure 17:
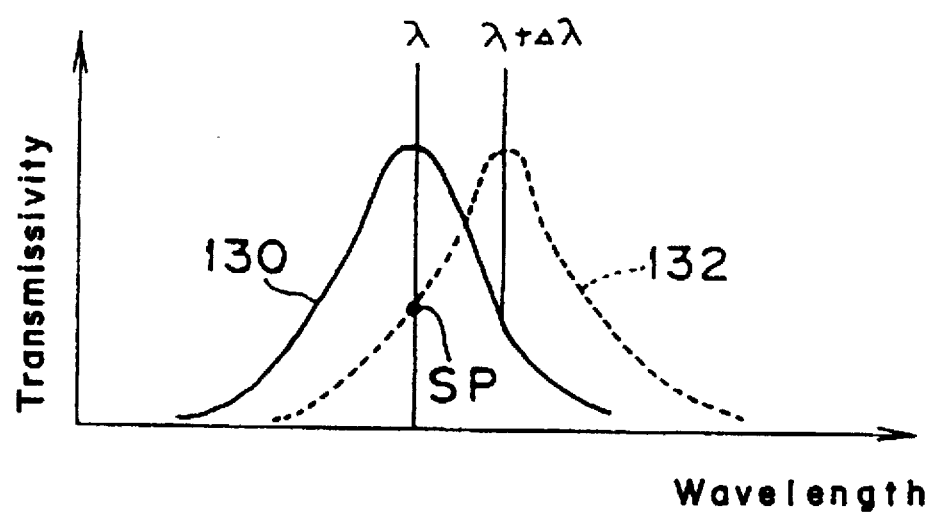
FIG. 17 is a diagram showing characteristics of a filter array shown in FIG. 16.

FIG. 17 is a diagram showing characteristics of the filter array 180 shown in FIG. 16. The ordinate represents the transmissivity whereas the abscissa represents the wavelength. A solid line denoted by reference numeral 130 is a characteristic of the main filter element 112 whereas a dashed line denoted by reference numeral 132 is a characteristic of the control filter element 114. As shown in the figure, the peak wavelength of the characteristic denoted by reference numeral 130 is $\lambda$ whereas the peak wavelength of the characteristic denoted by reference numeral 132 is $\lambda + \Delta\lambda$. Accordingly, by carrying out control to bring the intensity of a light output by the control filter element 114 to a stable point on the characteristic denoted by reference numeral 32 which stable point corresponds to the wavelength $\lambda$, the wavelength of a light output by the main filter element 112 can be stabilized at $\lambda$ without carrying out synchronization detection.

In order to implement such control, a control circuit 120 is employed in the optical transmitter shown in FIG. 16. The light output by the control filter element 114 is converted by a photo diode 116 into an electrical signal which is then amplified by an amplifier circuit 118 before being supplied to the control circuit 120. The control circuit 120 comprises a comparison circuit 122 for comparing the level of a signal output by the amplifier circuit 118 to a set reference 124, an error amplifier 126 for amplifying a signal output by the comparison circuit 122 and a light-source driving circuit 128 for driving the transmission-light source unit 68 so as to set the output level of the error amplifier 126 to zero or a fixed value.

Figure 18:
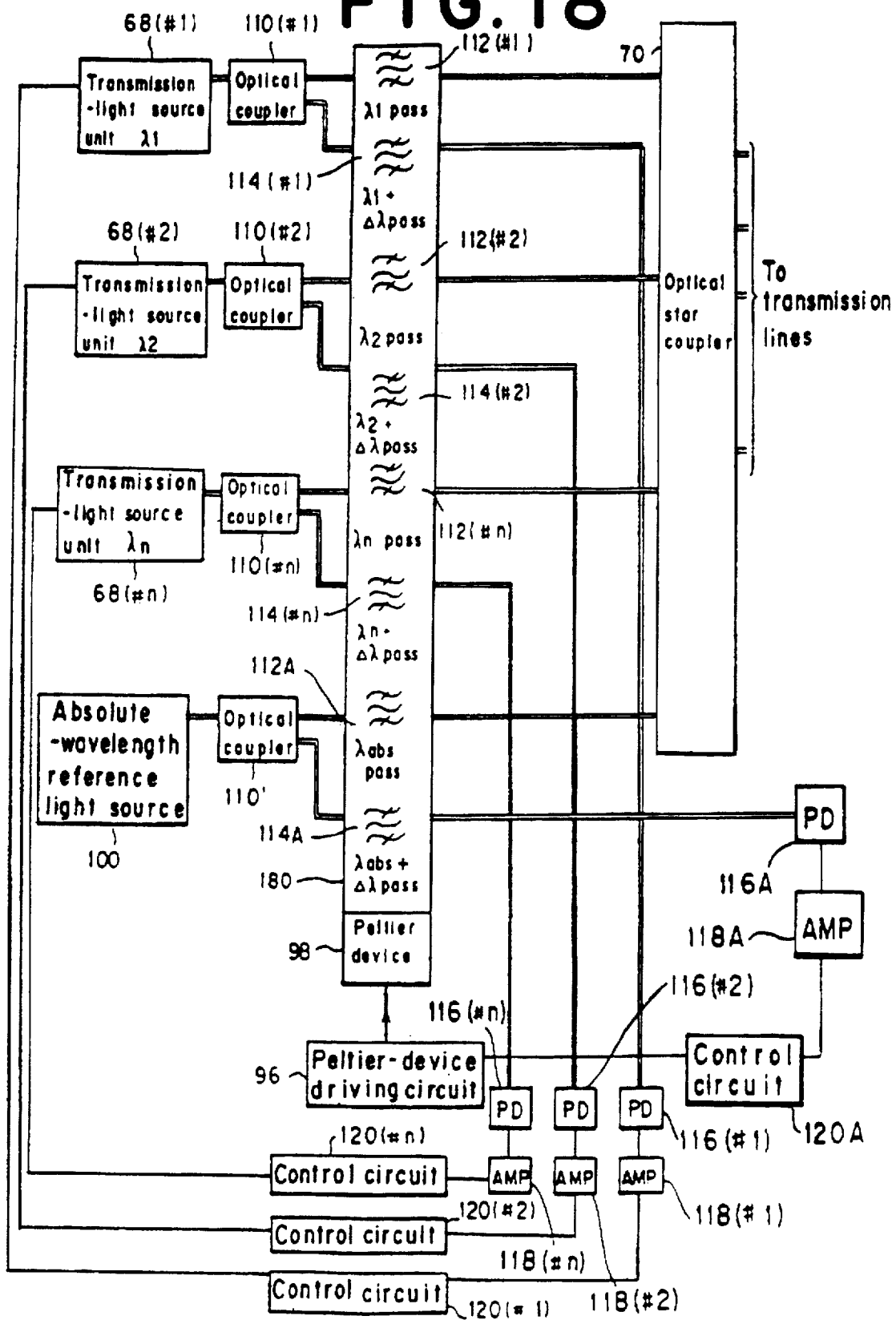
FIG. 18 is a block diagram showing a fourth embodiment of the optical transmission system.

FIG. 18 is a block diagram showing a fourth embodiment of the optical transmission system provided by the present invention. As shown in the figure, a plurality of optical transmitters shown in FIG. 16 are employed in the embodiment. The embodiment is characterized in that the optical-filter array for the optical transmitters are created on a single substrate common to all the optical transmitters. Lights generated by the transmission-light source units 68 (#1 to #n) are each split by one of the optical couplers 110 (#1 to #n). One of split lights output by each of the optical couplers 110 is supplied to an input port of the optical-filter array 180 which comprises main filter elements 112 (#1 to #n) having transmission-band center wavelengths $\lambda_1$ to $\lambda_n$ and control filter elements 114 (#1 to #n) having transmission-band center wavelengths $\lambda_1+\Delta\lambda$ to $\lambda_n+\Delta\lambda$.

The output ports of the main filter elements 112 (#1 to #n) are connected to an optical star coupler 70. The output of the optical star coupler 70 is connected to one or a plurality of optical transmission lines. On the other hand, the output ports of the control filter elements 114 (#1 to #n) are each connected to one of the photo diodes 116 (#1 to #n). In addition, much like the optical transmitter shown in FIG. 16, the amplifier circuits 118 (#1 to #n) and the control circuits 120 (#1 to #n) are provided for controlling the wavelengths of the transmission-light source units 68 (#1 to #n) for all channels.

Furthermore, in this embodiment, in order to stabilize the absolute value of the transmission-band center wavelength of the optical-filter array 180, a main filter element 112A having a transmission-band center wavelength $\lambda$ abs and a control filter element 114A having a transmission-band center wavelength $\lambda_{abs}+\Delta\lambda$ are provided, being integrated with other filter elements 112 (#1 to #n) and 114 (#1 to #n) to form a single device. A light generated by the absolute-wavelength reference light source 100 is split by an optical coupler 110' into a light supplied to the main filter element 112A and a light supplied to the control filter element 114A. A light output by the main filter element 112A is sent to a transmission line through the optical star coupler 70 whereas a light output by the control filter element 114A is supplied to a photo diode 116A. In order to make the transmission-band center wavelength of the main filter element 112A match the wavelength of the absolute-wavelength reference light source 100, the amplifier circuit 118A, the control circuit 120A, the Peltier-device driving circuit 96 and the Peltier device 98 are provided in conformity to the embodiment shown in FIG. 14. This embodiment allows wavelengths in a transmission system adopting the WDM technique to be stabilized without carrying out the synchronization detecting function. On the top of that, an optical-filter array is employed to serve as wavelength references to provide the same effects as those described earlier.

Figure 19:
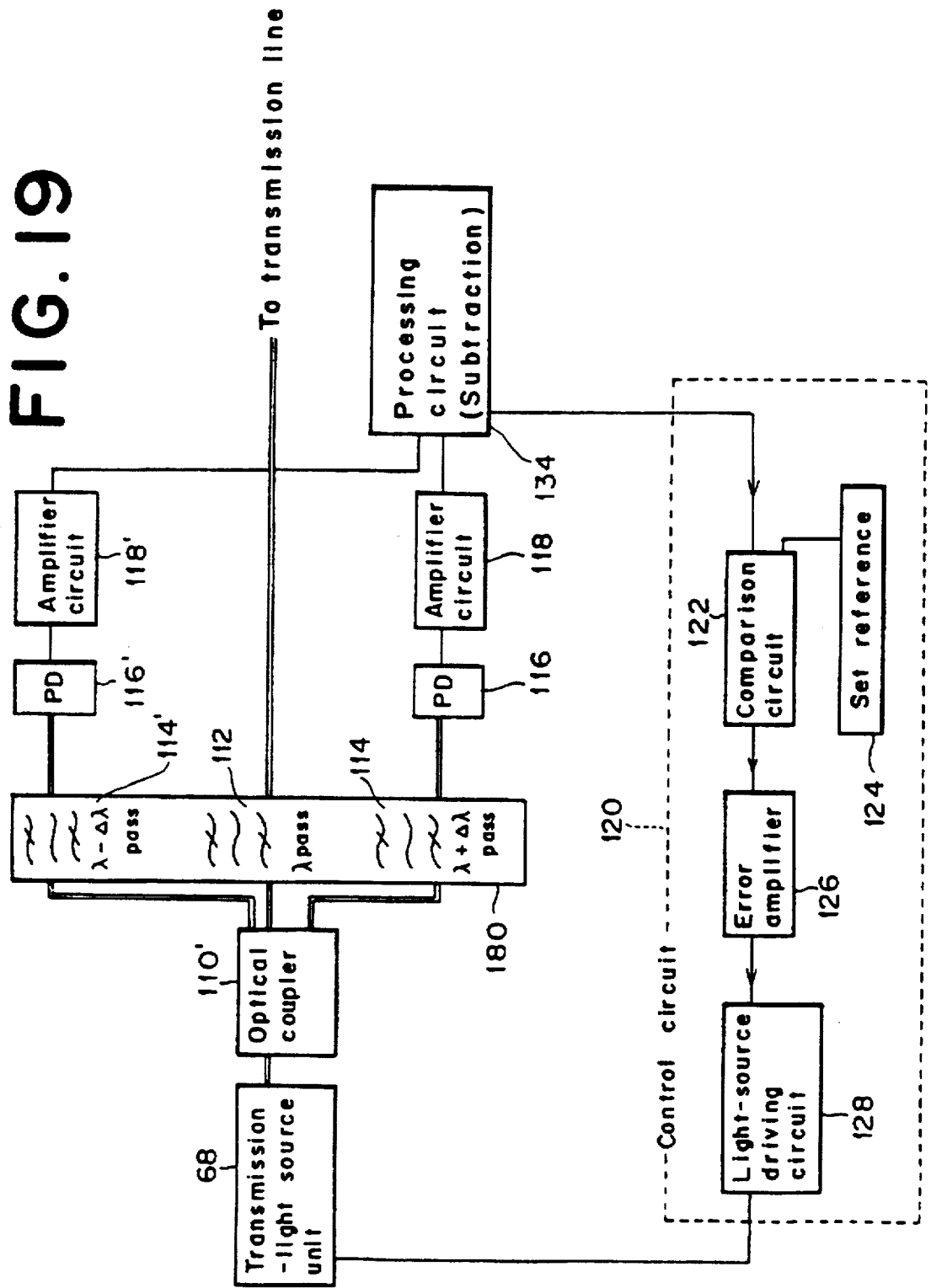
FIG. 19 is a block diagram showing a fourth embodiment of the optical transmitter.

FIG. 19 is a block diagram showing a fourth embodiment of the optical transmitter provided by the present invention. In comparison with the embodiment shown in FIG. 16, the fourth embodiment is characterized in that, in addition to the control filter element 114 having a transmission-band center wavelength $\lambda+\Delta\lambda$, the optical-filter array 180 also employs another control filter element 114' having a transmission-band center wavelength $\lambda-\Delta\lambda$. A light generated by the transmission-light source unit 68 is split into three lights by the optical coupler 110'. The three split lights are supplied to the main filter element 112, the control filter element 114 and the other control filter element 114' respectively. A light output by the control filter element 114 is converted into an electrical signal by the photo diode 116. The electrical signal is amplified by the amplifier circuit 118 before being supplied to a processing circuit 134. Likewise, a light output by the other control filter element 114' is converted into another electrical signal by a photo diode 116' The other electrical signal is amplified by another amplifier circuit 118' before being supplied to the processing circuit 134. The output signal of the processing circuit 134 is then supplied to the control circuit 120.

Figure 20:
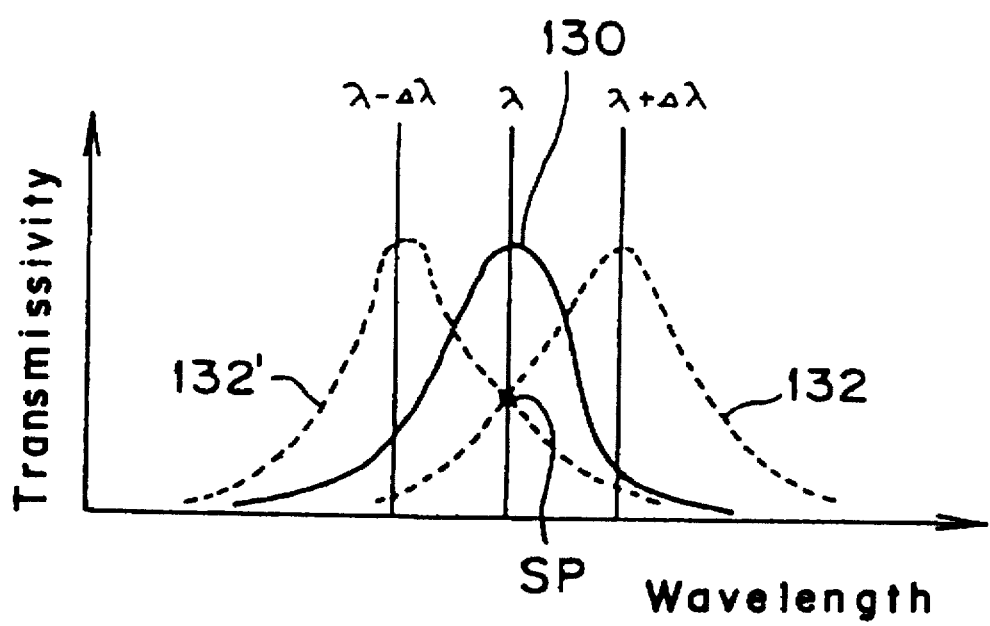
FIG. 20 is a diagram showing characteristics of a filter array shown in FIG. 19.

FIG. 20 is a diagram showing characteristics of the optical-filter array shown in FIG. 19. Reference numeral 130 denotes a characteristic of the main filter element 112 whereas reference numerals 132 and 132' denote characteristics of the control filter elements 114 and 114' respectively. Notation SP indicates a stable point. The differences $\Delta\lambda$ in transmission-band center wavelength between the control filter elements 114 and 114' and the main filter element 112 are typically set at the half width at half maximum of the characteristics of the filter elements 112, 114 and 114'. That is to say, the transmission-band center wavelengths of the filter elements 112, 114 and 114' are set at $\lambda$, $\lambda+\Delta\lambda$ and $\lambda-\Delta\lambda$ so that, when a light generated by the transmission-light source unit 68 passes through the main filter element 112 at the maximum transmissivity, only 50% of the maximum powers of the lights arriving at the control filter elements 114 and 114' are passed on by them.

Now, let the wavelength of the transmission-light source unit 68 slightly increase. In this case, the output of the control filter element 114 also increases while that of the other control filter element 114' inversely decreases. When the wavelength of the transmission-light source unit 68 slightly decreases, on the other hand, the output of the control filter element 114 also decreases while that of the other control filter element 114' conversely increases. In this way, the outputs of the control filter elements 114 and 114' complement each other. Taking this symmetrical characteristic into consideration, control is carried out by subtracting the output of one of the control filter elements 114 and 114' from that of the other and making the result of the subtraction zero. At a zero subtraction result, a light generated by the transmission-light source unit 68 passes through the main filter element 112 at a maximum transmissivity. The operation to carry out the subtraction is done by the processing circuit 134.

This embodiment has a merit that, even if the light output of the transmission-light source unit 68 fluctuates, the controlled wavelength is not affected by the fluctuation. That is to say, even if the powers of the lights supplied to the control filter elements 114 and 114' fluctuate, the wavelength that causes the processing circuit 134 to output a zero as a subtraction result is fixed. It should be noted, however, that since the loop gain of the control system as a whole fluctuates, it is desirable to set the loop gain at a value that can tolerate fluctuations in light outputs.

Figure 21:
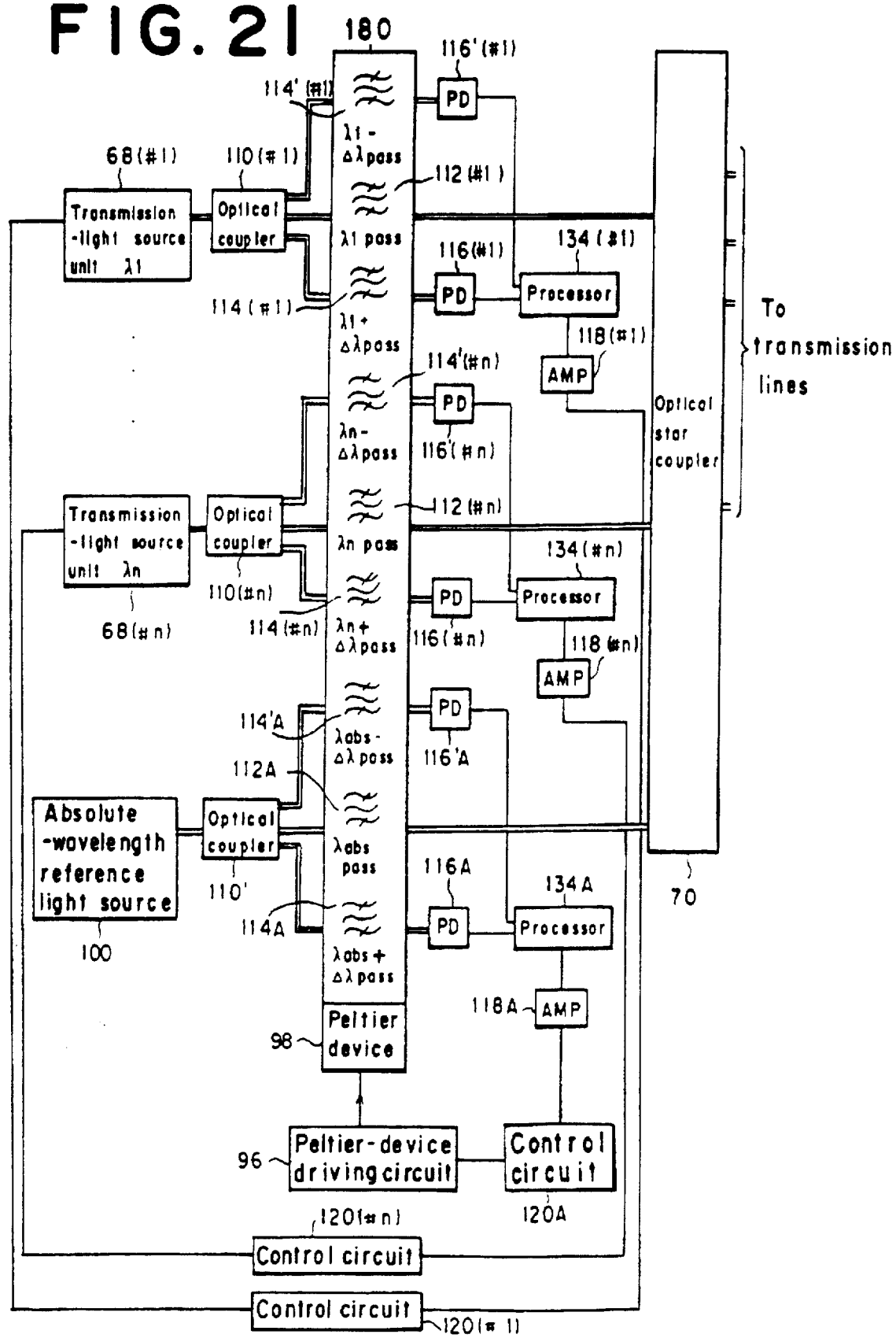
FIG. 21 is a block diagram showing a fifth embodiment of the optical transmission system.

FIG. 21 is a block diagram showing a fifth embodiment of the optical transmission system provided by the present invention. In this embodiment which adopts the WDM technique, a plurality of optical transmitters shown in FIG. 19 are employed. In comparison with the optical transmission system shown in FIG. 18, this embodiment is characterized in the same way as the optical transmitter shown in FIG. 19 is characterized in comparison with the optical transmitter shown in FIG. 16. For this reason, the characterizations of this embodiment need not be explained.

Figure 22:
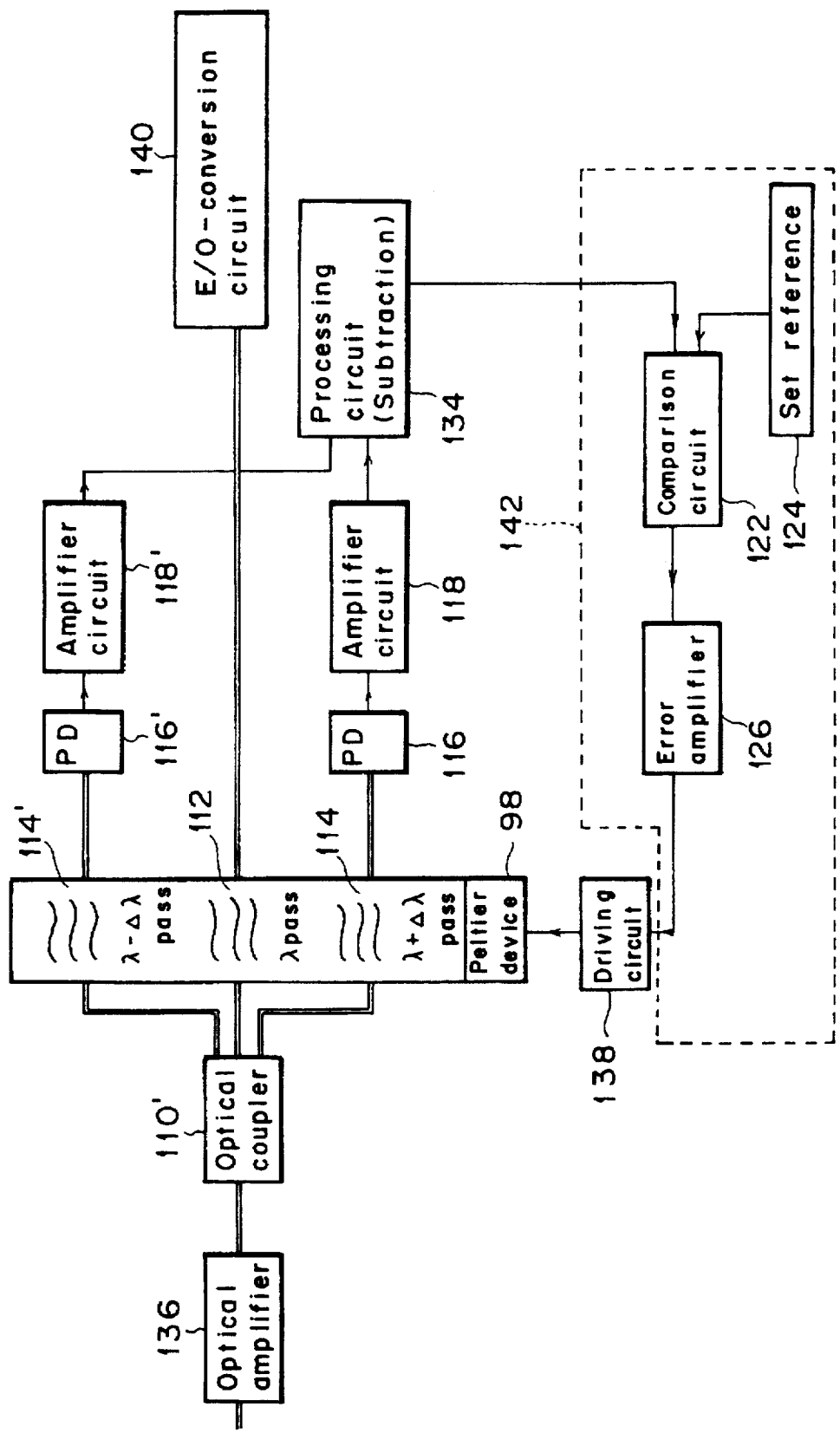
FIG. 22 is a block diagram showing an embodiment of an optical receiver.

FIG. 22 is a block diagram showing an embodiment of an optical receiver which does not implement synchronization detection. A signal light received from an optical transmission line not shown in the figure is amplified by an optical amplifier 136 before being split by the optical coupler 110' into three lights. The three split lights are supplied to the filter elements 112, 114 and 114' constituting the same optical-filter array 180 as that of the optical transmitter shown in FIG. 19. A light output by the main filter element 112 is supplied to an E/O conversion circuit 140 to be converted into an electrical signal conveying transmitted data.

A light output by the control filter element 114 is converted into an electrical signal by the photo diode 116. The electrical signal output by the photo diode 116 is amplified by the amplifier circuit 118 before being supplied to the processing circuit 134. Likewise, a light output by the other control filter element 114' is converted into another electrical signal by a photo diode 116'. The other electrical signal is amplified by another amplifier circuit 118' before being supplied to the processing circuit 134. A signal output by the processing circuit 134 is then supplied to a control circuit 142. The control circuit 142 controls the Peltier device 98 in accordance with the signal received from the processing circuit 134 in order to stabilize the wavelength. The control circuit 142 comprises the comparison circuit 122 for comparing the level of the signal output by the processing circuit 134 to a set reference 124, the error amplifier 126 for amplifying a signal output by the comparison circuit 122 and a driving circuit 138 for providing a driving current to the Peltier device 98 so as to set the output level of the error amplifier 126 to zero or a fixed value.

Figure 23:
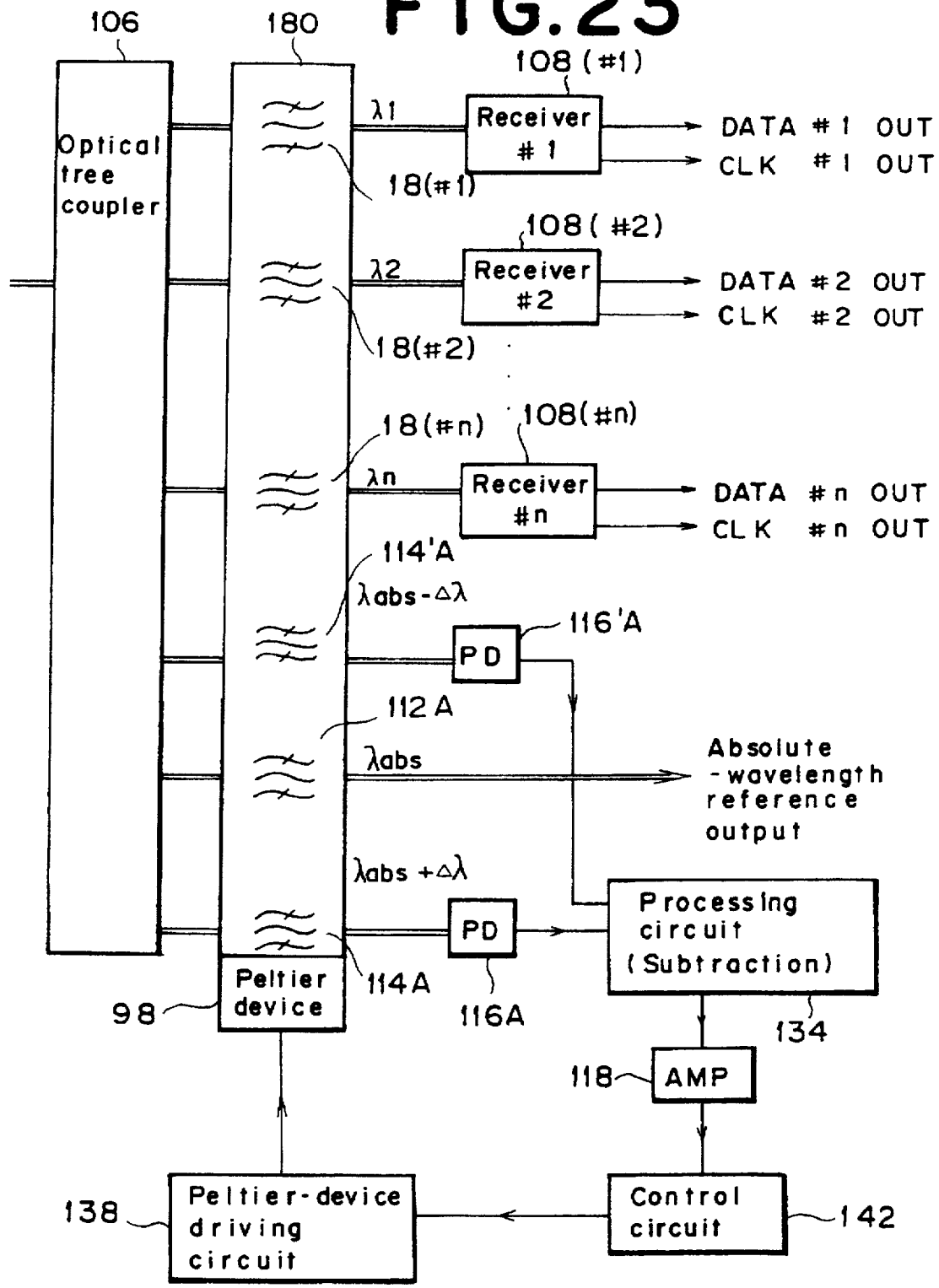
FIG. 23 is a block diagram showing a second embodiment of the optical reception system.

FIG. 23 is a block diagram showing a second embodiment of the optical reception system. Adopting the principle of the optical receiver shown in FIG. 22, the embodiment stabilizes the wavelengths of the optical-filter array 180. A WDM signal light is received using the stabilized optical-filter array 180. These operations are carried out in concrete terms as follows.

In the system shown in FIG. 15, the control circuit 94 implements synchronization detection. On the contrary, the system implemented by this second embodiment is characterized in that the control circuit 142 employed therein does not carry out synchronization detection as the control circuit 142 shown in FIG. 22 does. That is to say, a main filter element 112A having a transmission-band center wavelength $\lambda_{abs}$, a control filter element 114A having a transmission-band center wavelength $\lambda_{abs}+\Delta\lambda$ and another control filter element 114'A having a transmission-band center wavelength $\lambda_{abs}-\Delta\lambda$ are provided as components integrated with the other filter elements 18 (#1 to #n) in the optical-filter array 180 and split lights output by the optical tree coupler 106 are supplied to all the filter elements 112A, 114A, 114'A and 18 (#1 to #n). A light output by the main filter element 112A can be used effectively in the optical reception system to serve as an absolute wavelength reference. In addition, lights output by the control filter elements 114A and 114'A can be used to stabilize the wavelengths without carrying out synchronization detection.

An apparatus or system that adopts none of some synchronization-detection techniques described above is characterized in that, even though the configuration of the optical-filter array thereof is complicated, the control signals of the light sources and the optical-filter array do not have any effects on the reception characteristics. When the synchronization-detection technique is adopted, a small variation is applied to the controlled object in order to generate a control signal. Since the phase of a given signal is compared to the phase of a signal obtained from the control signal, the operation to apply the small variation to the controlled object causes the transmitted signal disturbance, giving rise to some fear of the transmitted signal deteriorating. When the synchronization-detection technique is not used, on the other hand, it is not necessary to apply small variations to the controlled object. As a result, an embodiment adopting no such synchronization detection is suitable to an application wherein each filter element in the optical-filter array is a narrow-band band-pass filter.

When constructing an optical communication system through combination of the optical transmission system and the optical reception system described above wherein an optical-filter array is employed in both the optical transmission system and the optical reception system, it is ideal to use an optical-filter array in the optical transmission system which optical-filter array has characteristics matching those of an optical-filter array used in the optical reception system. For this reason, when optical-filter arrays like the one shown in FIG. 12 are manufactured, the base substrate of the optical-filter arrays manufactured by using the same process is cut into pieces for the optical transmission system and the optical reception system. In this way, the optical-filter array used in the optical transmission system has characteristics matching those of the optical-filter array used in the optical reception system.

By the way, a semiconductor laser (or a laser diode) or, in particular, a laser diode of the distributed feedback type which oscillates in the single vertical mode is normally used as a light source for the WDM system. In the case of such a laser diode, the oscillation wavelength is all but determined by the period of a grating created in the device. Due to a problem caused by manufacturing variances, however, variations of about several nm are resulted in among wavelengths of laser diodes manufactured even at the same lot. As for laser diodes produced at different lots, their wavelengths may exhibit variations of several tens of nm. As a result, selection work needs to be done prior to the delivery of a plurality of laser diodes which are suitable for a WDM system, inevitably giving rise to a high cost.

Figure 24:
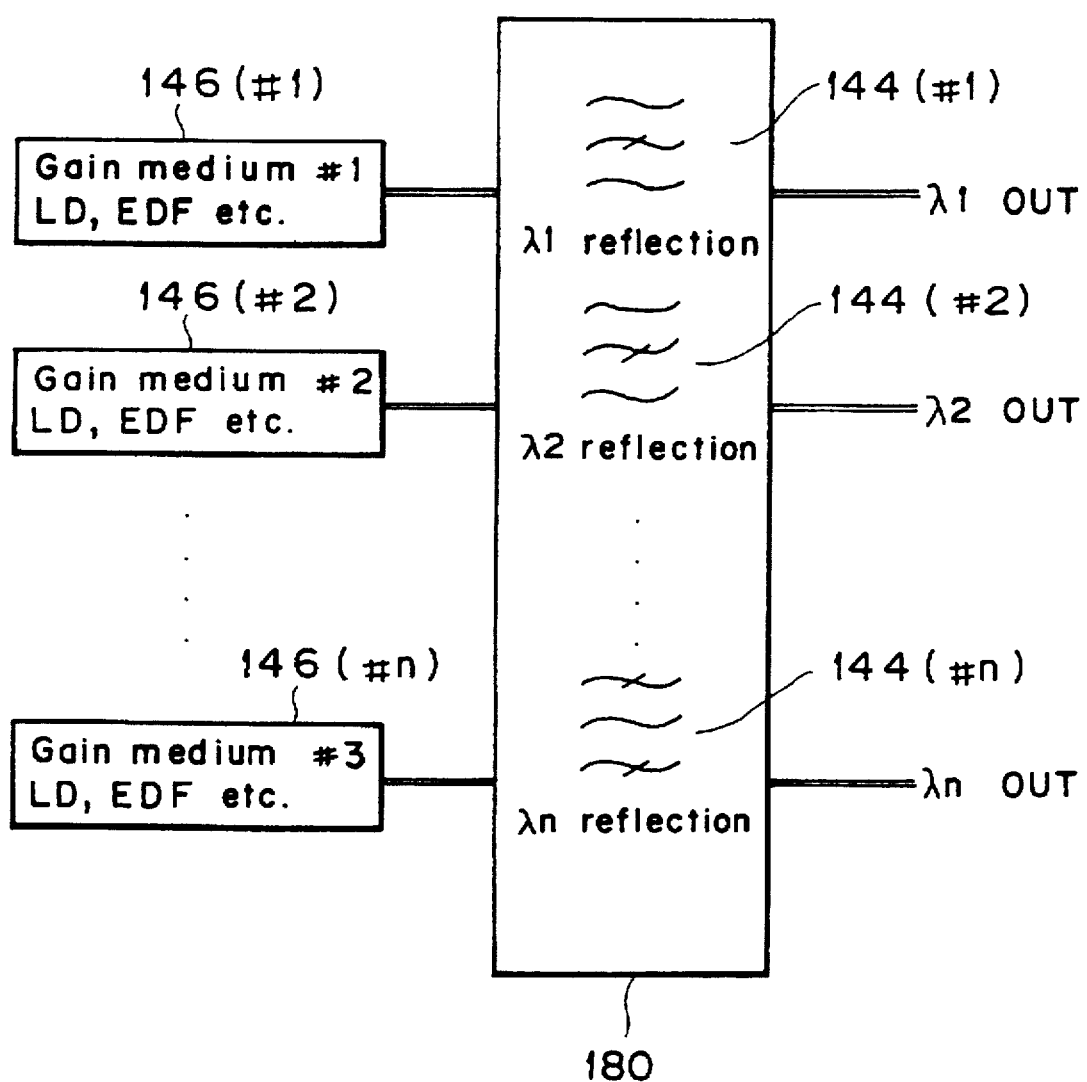
FIG. 24 is a diagram showing a basic configuration of a WDM light source.

FIG. 24 is a diagram showing a basic configuration of a WDM light source whereby a desired oscillation wavelength can be obtained with ease. In this example, the optical-filter array 180 comprises a plurality of optical-filter elements 144 (#1 to #n) which each have a band-rejection (notch) characteristic. The band-rejection characteristic of an optical filter is just opposite to the band-pass characteristic described earlier. In this example, lights having wavelengths $\lambda_1$ to $\lambda_n$ are therefore reflected by the optical-filter elements 144 (#1 to #n).

As shown in the figure, gain media 146 (#1 to #n) are optically connected to the input ports of the optical-filter elements 144 (#1 to #n). As the gain media 146 (#1 to #n), semiconductor lasers (or semiconductor-laser amplifiers) coated with AR (or a non-reflecting film) or fibers doped with a rare earth material can be used. In this configuration, laser oscillation can be excited at reflection peak wavelengths of the optical-filter elements, allowing light sources having desired wavelengths to be obtained and the wavelength interval as well as the absolute wavelengths to be controlled in a uniform manner.

Figure 25:
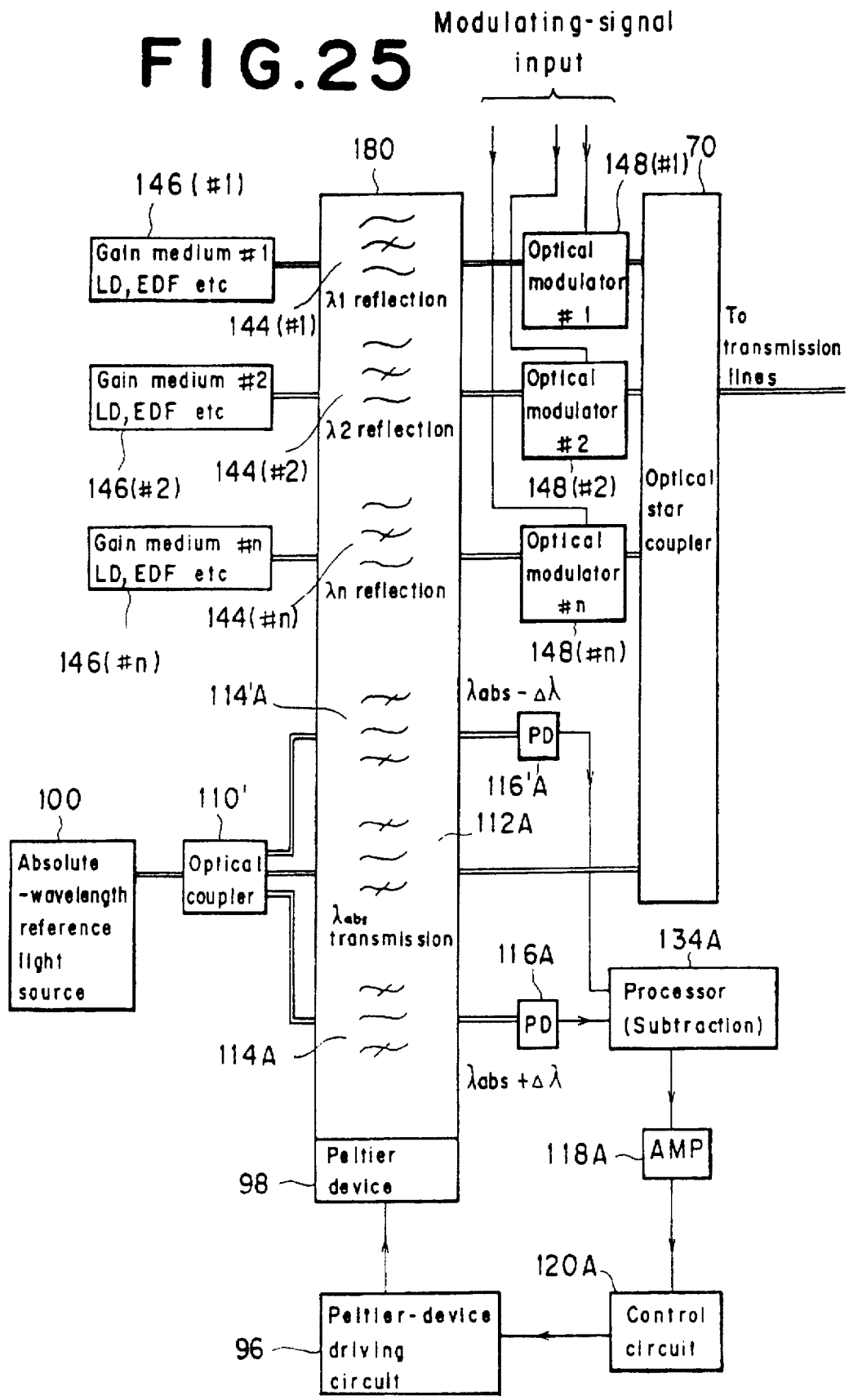
FIG. 25 is a block diagram showing a sixth embodiment of the optical transmission system.

FIG. 25 is a block diagram showing a sixth embodiment of the optical transmission system provided by the present invention. In comparison with the system shown in FIG. 21, this embodiment is characterized in that the WDM light sources shown in FIG. 24 are employed as substitutes for the transmission-light source units 68 (#1 to #n) of FIG. 21. Lights output by the filter elements 144 (#1 to #n) are individually modulated by optical modulators 148 (#1 to #n) before being transmitted to a single transmission line or a plurality of transmission lines, not shown in the figure, through the optical star coupler 70. In this embodiment, the wavelengths of the optical-filter array 180 are stabilized by using the same means described earlier wherein the absolute-wavelength reference light source 100 is used. As a result, the control of the wavelength for each light source is not required, allowing the configuration of the optical transmission system to be simplified.

Figure 26:
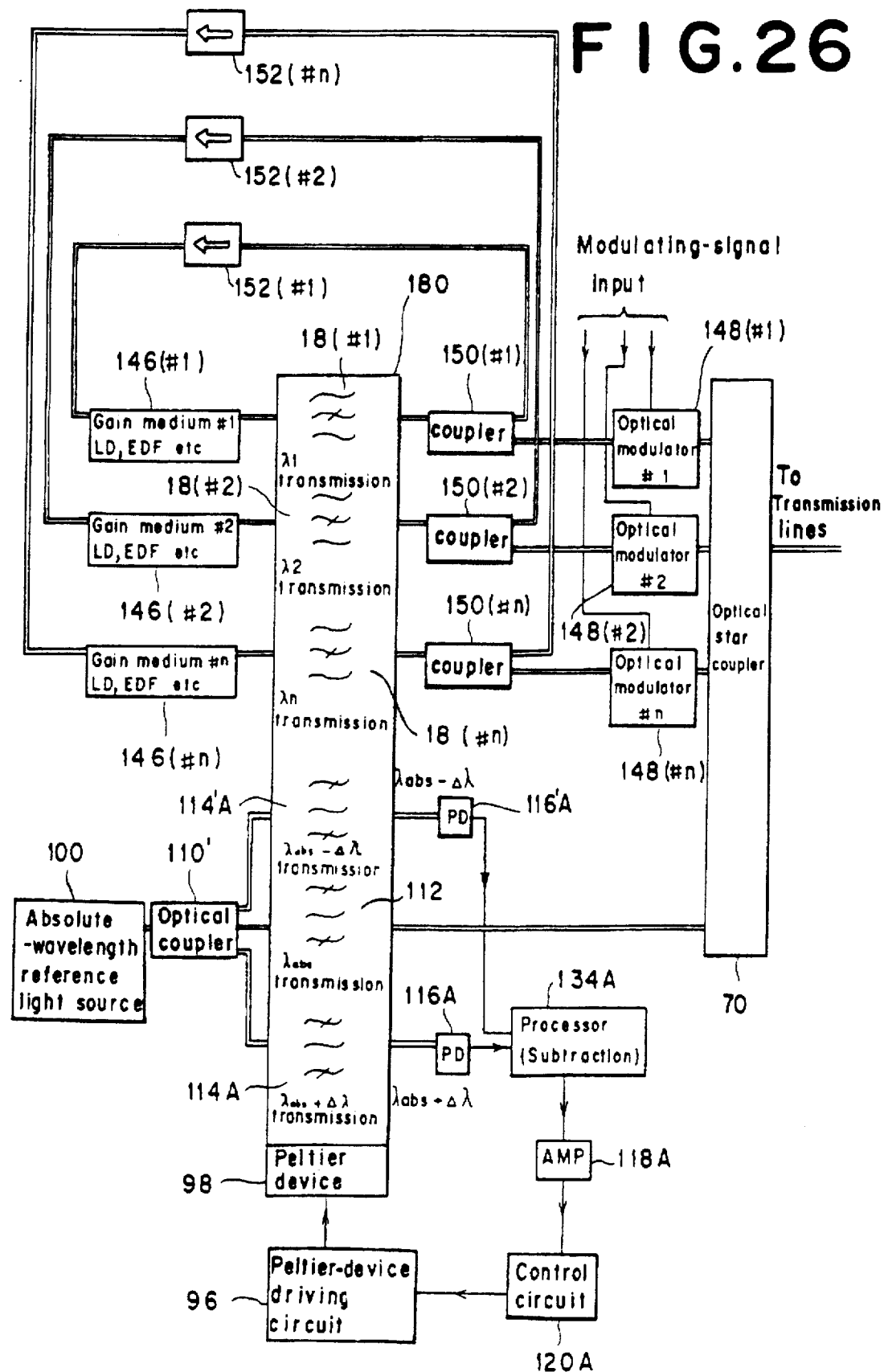
FIG. 26 is a block diagram showing a seventh embodiment of the optical transmission system.

FIG. 26 is a block diagram showing a seventh embodiment of the optical transmission system provided by the present invention. In comparison with the system shown in FIG. 25, this embodiment is characterized in that the filter elements 18 (#1 to #n) each having a band-pass characteristic are employed as substitutes for the filter elements each having a band-rejection characteristic and laser oscillation is generated by using a ring-type oscillator.

Lights output from first exciting ends of the gain media 146 (#1 to #n) pass through the filter elements 18 (#1 to #n) before being split by optical couplers 150 (#1 to #n). One of two split lights output by each of the optical couplers 150 (#1 to #n) is fed back to a second exciting end of the originating gain media 146 through an optical isolator 152. As shown in the figure, as many optical isolators 152 (#1 to #n) as the gain media 146 (#1 to #n) are employed. The other split light is modulated by one of the optical modulators 148 (#1 to #n) before being transmitted to optical transmission line, not shown in the figure, through the optical star coupler 70. In the case of this embodiment, each of the filter elements 18 constituting the optical-filter array 180 is a band-pass filter, making it easy to manufacture the optical-filter array 180.

Figure 27:
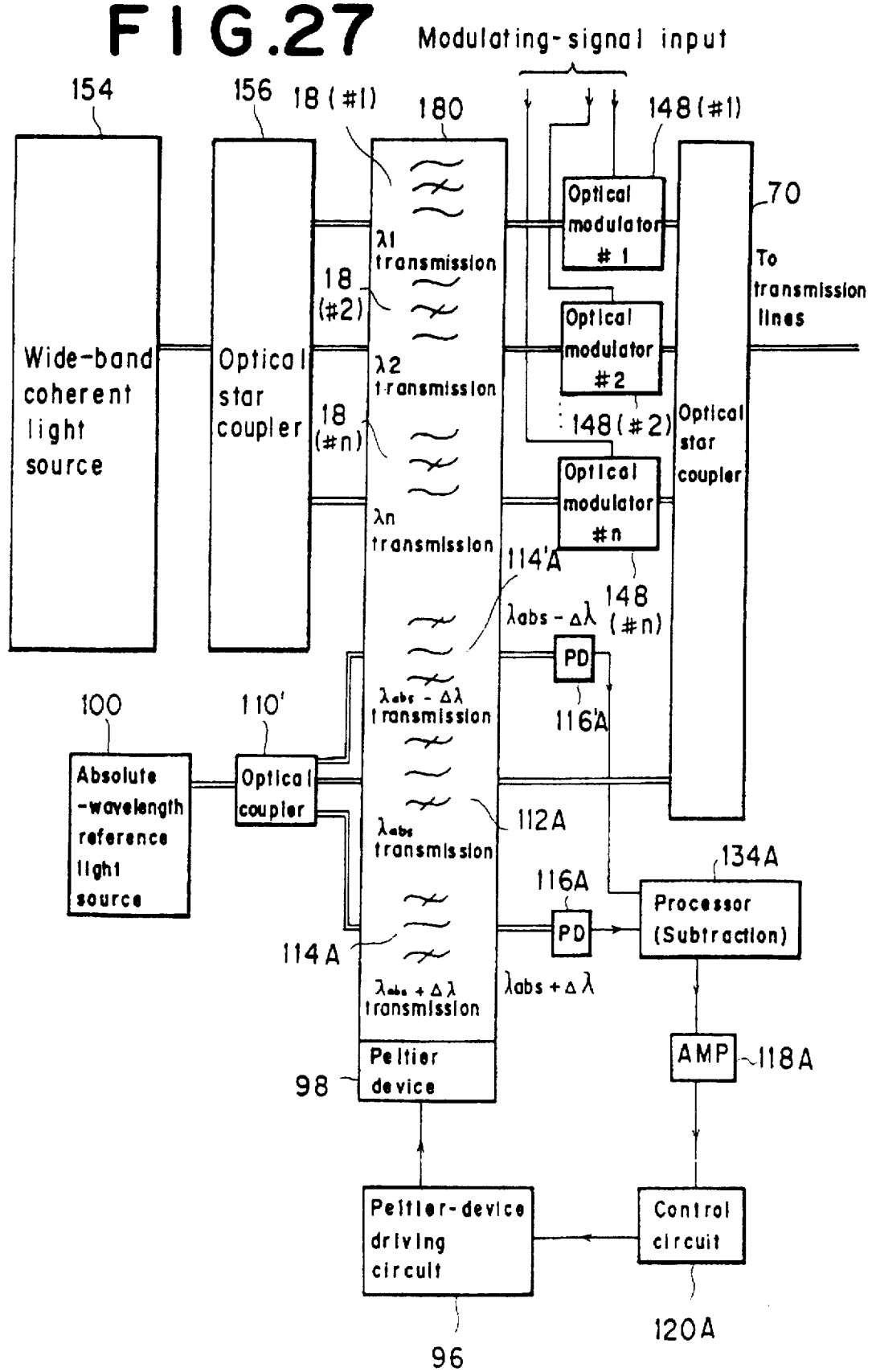
FIG. 27 is a block diagram showing an eighth embodiment of the optical transmission system.

FIG. 27 is a block diagram showing an eighth embodiment of the optical transmission system provided by the present invention. Much like the optical transmission system shown in FIG. 26, this embodiment employs the optical-filter array 180 comprising the band-pass filter elements 18 (#1 to #n) having transmission-band center wavelengths $\lambda_1$ to $\lambda_n$. A light generated by a coherent light source 154 oscillating in a distributed manner over a wide band (in a white state) is split into n lights by an optical star coupler 156. The n split lights are then supplied to the input ports of the filter elements 18 (#1 to #n). Lights output from the output ports of the filter elements 18 (#1 to #n) are then modulated by the modulators 148 (#1 to #n) before being transmitted to a single transmission line or a plurality of transmission lines, not shown in the figure, through the optical star coupler 70. For more detailed information on a light source oscillating in a distributed manner over a wide band, refer to a reference such as a document written by Mori et al. with the title "A Wide-Band Pulse-Light Source Adopting an LD Excitement Supercontinuum Technique", presented to a fall conference of the Academic Society of Electronic, Information and Communication Engineers, 1993, B-920.

By the way, in a transmission system employing optical amplifiers, it is desirable to remove as many ASE components as possible which ASE components exist in regions of wavelengths other than the wavelength of the signal light. If a signal light containing unnecessary ASE components is supplied to an optical amplifier, the ASE components are also amplified as well. As a result, the energy of a pump light for amplifying the signal light is wasted, causing the amplification factor and the noise characteristic to deteriorate.

Figure 28:
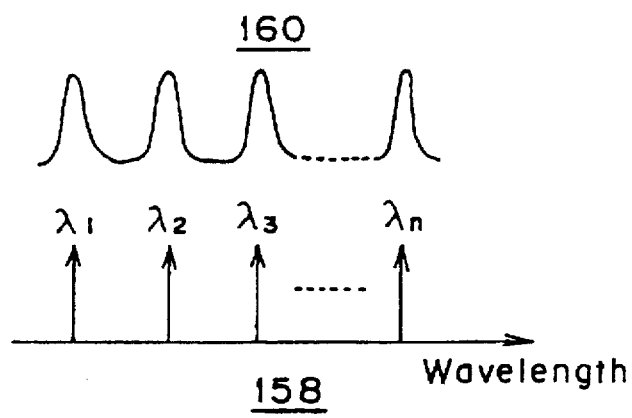
FIG. 28 is a diagram showing typical characteristics of optical filters used in a WDM system.

FIG. 28 is a diagram showing typical characteristic of optical filters used in a WDM system. As shown in the figure, the WDM system employs optical filters which each selectively filter a light having the same wavelength as that of a signal light, allowing the ASE components to be reduced. Reference numeral 158 shown in the figure is spectra of signal lights which are arranged along the horizontal axis at equal intervals. Reference numeral 160 denotes characteristics of optical filters with the transmission-band center wavelengths thereof arranged at equal intervals. The characteristics each correspond to one of the spectra. In the case of signal lights with the wavelengths thereof separated from each other by equal intervals, a Fabri-Petrot interference meter can be used as an optical filter. For signal lights with the wavelengths thereof separated from each other by unequal intervals, on the other hand, a grating-type filter can be used instead.

With optical filters inserted along a transmission line in this way, control of the wavelengths of light sources is a premise. When the wavelength intervals among the light sources are to be sustained at a constant value, it is desirable to have the transmission characteristics of the optical filters follow variations in absolute wavelengths of the transmission-light sources. For this reason, the output of each optical filter is split and control is carried out so as to maximize the light output. The control is implemented in concrete terms as follows.

Figure 29:
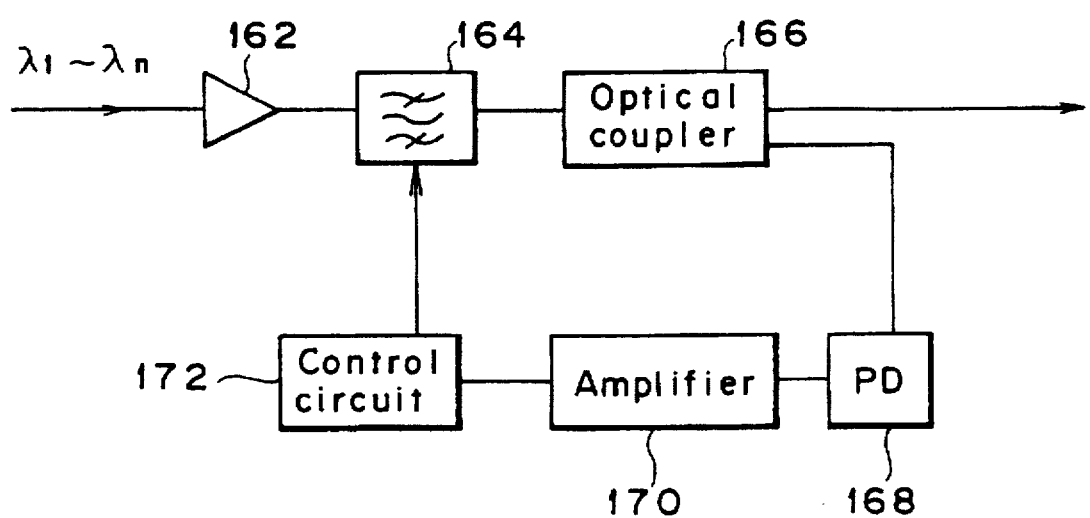
FIG. 29 is a diagram showing an embodiment implementing tracking control of an optical filter.

FIG. 29 is a diagram showing an embodiment implementing tracking control of an optical filter. Reference numeral 162 is an optical amplifier inserted on an optical transmission line. On the down-stream side of the optical amplifier 162, an optical filter 164 such as a Fabri-Petrot interference meter is provided. A light output by the optical filter 164 is split by an optical coupler 166. One of the two split lights is output to a transmission line. The other split light is converted by a photo diode 168 into an electrical signal which is then amplified by an amplifier 170 before being supplied to a control circuit 172. The control circuit 172 controls the optical filter 164 so as to maximize the level of the supplied signal.

It is desirable to apply the system implemented by this embodiment to a case in which the spacing among the wavelengths $\lambda_1$ to $\lambda_n$ of the signal lights is fixed. That is to say, in this case, by controlling the optical filter so as to keep the total light output at a maximum value all the time, it is possible to adjust the transmission-band center wavelength of the optical filter to a value equal to the wavelength of the signal light.

Figure 30:
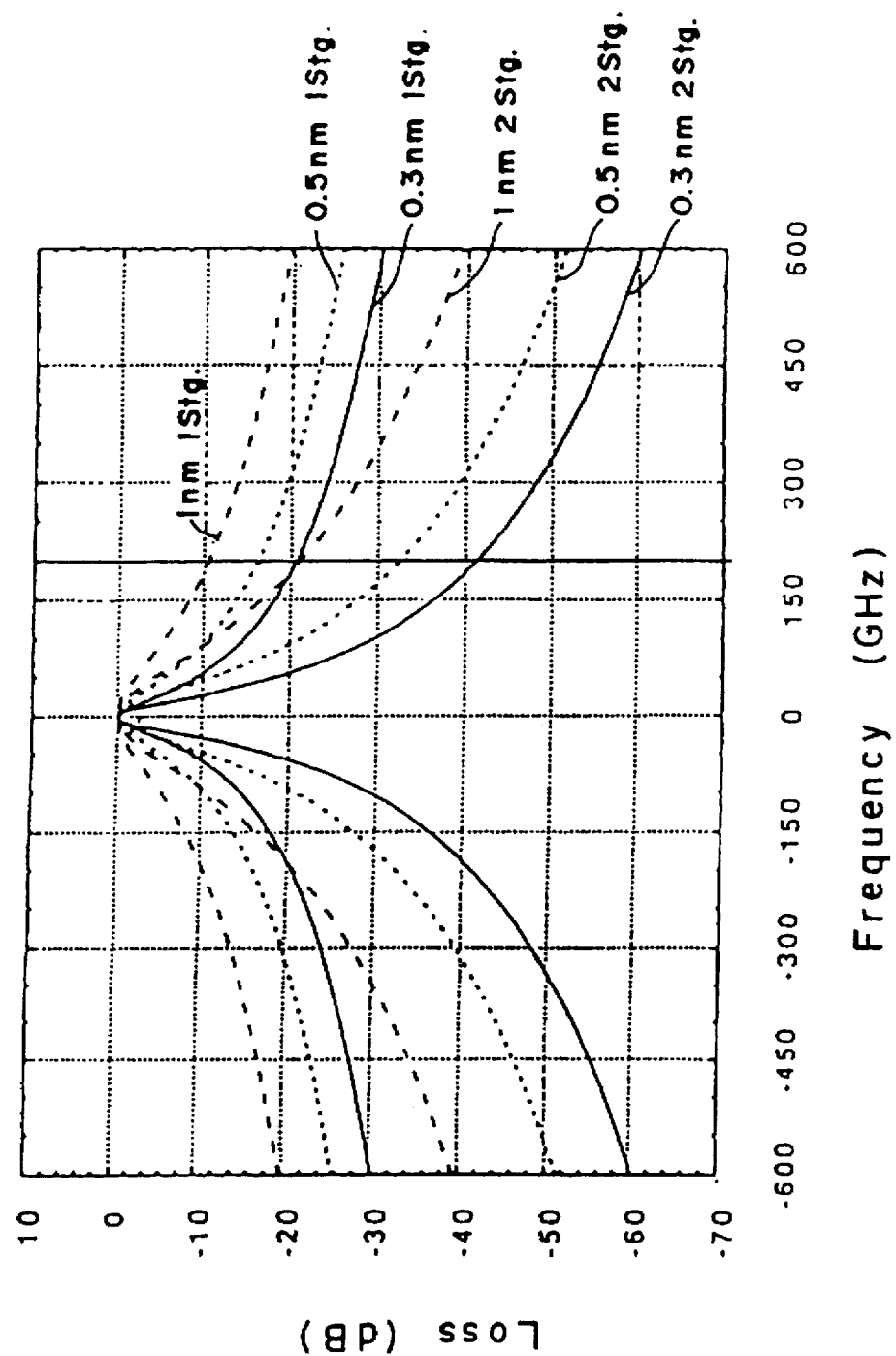
FIG. 30 is a diagram showing a cut-off characteristic of an interference filter.

In the case of a dielectric-film interference filter used as a narrow-band optical filter array, the cut-off characteristic of the transmission wavelength is all but a Lorentz function. FIG. 30 is a diagram showing a cut-off characteristic of an interference filter. It is obvious from the figure that, by assuming that the light power is the same for all wavelengths, a piece of interference filter with a 3-dB transmission wavelength bandwidth of 0.3-nm is not adequate to suppress the cross talk among adjacent wavelengths below a typical value of 20 dB for a wavelength interval of 1 nm. Instead, two or more interference filters with a 3-dB transmission wavelength bandwidth of the order of 0.5 nm which interference filters are superimposed one upon another are required. It should be noted that the 1-nm wavelength interval corresponds to about 125 GHz in a band of 1.55 microns and the cross talk's value smaller than 20 dB is required so as not to affect the reception quality. This cross-talk requirement for the optical filter applies to the optical filters for stabilizing wavelengths on the transmitter side described earlier as well as to the wavelength selecting filters on the receiver side.

Figure 31:
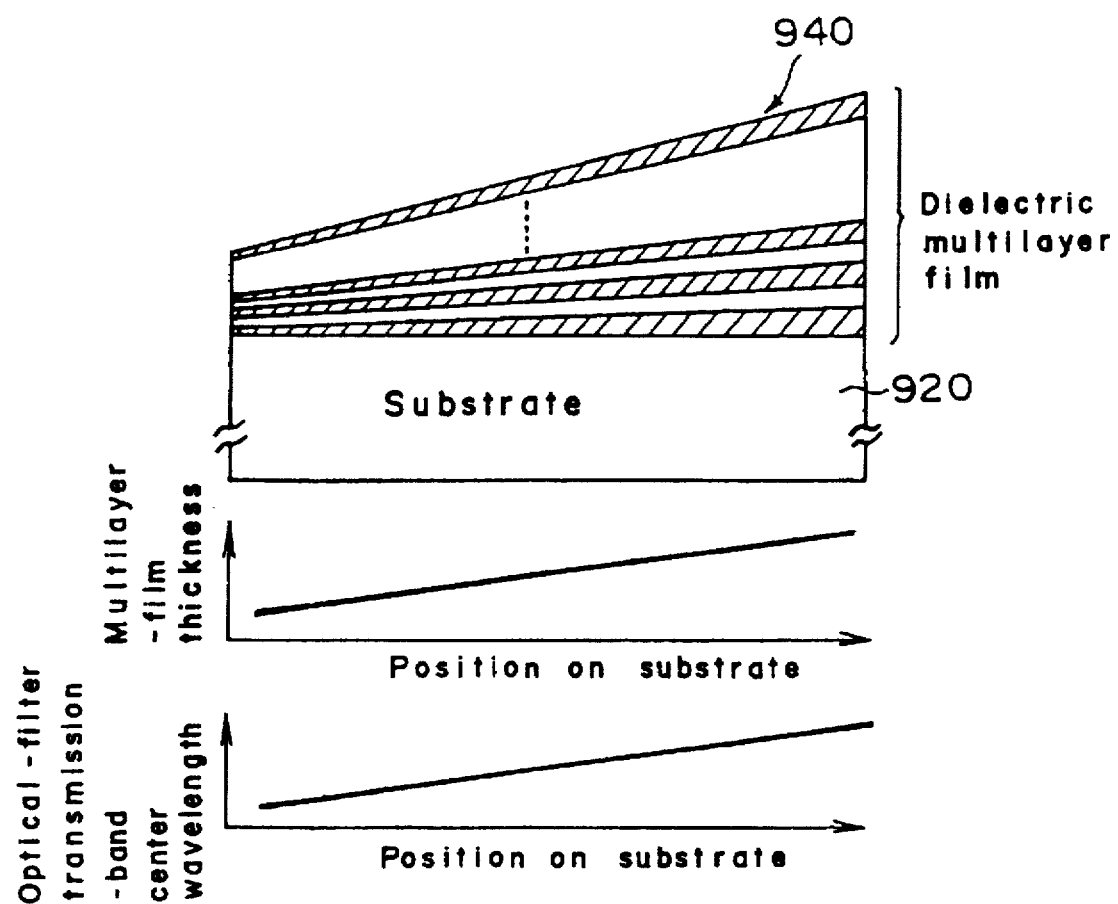
FIG. 31 is a diagram showing a typical interference filter.

As disclosed in Japanese Patent Laid-open No. HEI 5-281480, with the interference filter comprising a plurality of dielectric-film layers placed one upon another, the transmission wavelength can be changed by varying the thicknesses of the dielectric films constituting a set of layers placed one upon another. Accordingly, in order to provide an easily reproducible predetermined transmission wavelength, it is required that the thicknesses of the dielectric films be controlled with a high degree of accuracy. In order to obtain a narrow-band band-pass filter with a 3-dB transmission wavelength bandwidth smaller than about 1 nm, it is necessary to place more than 20 layers of dielectric films one upon another. As a result, it is difficult to provide a narrow-band filter having an easily reproducible predetermined wavelength. For example, in some cases, the transmission wavelength inevitably differs from manufacturing lot to manufacturing lot by about several nm. It is known, however, that the surface distribution of transmission wavelengths on the same substrate is relatively stable. For this reason, a plurality of dielectric-film layers 940 are created on a substrate 920 typically with their thicknesses smoothly increasing as shown in FIG. 31. As a result, in each of optical filters manufactured at even different lots, a desired transmission-wavelength region that covers the wavelength region of any light source always exists. This portion is then separated away from the base substrate of the interference filters shown in FIG. 31 and, from this portion, an optical-filter array shown in FIG. 12 is created. In this way, an optical-filter array having a desired characteristic can thus be obtained at a high yield.

Figure 32:
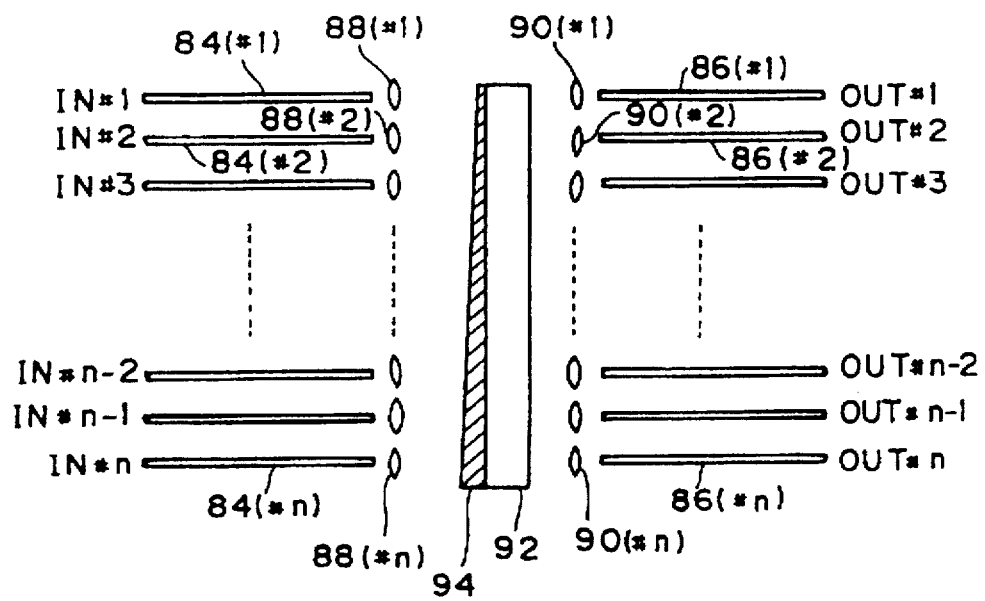
FIG. 32 is a view showing a first concrete embodiment of the optical-filter array shown in FIG. 12.

FIG. 32 is a view showing a first concrete embodiment of the optical-filter array shown in FIG. 12. In this embodiment, the input ports of this optical-filter array are a plurality of input-side optical fibers 84 (#1 to #n) which are placed in parallel to each other at equal intervals. Similarly, the output ports of this optical-filter array are a plurality of output-side optical fibers 86 (#1 to #n) which are placed in parallel to each other also at equal intervals. The output-side optical fibers 86 correspond to the input-side optical fibers 84 on a one-to-one basis.

Figure 33:
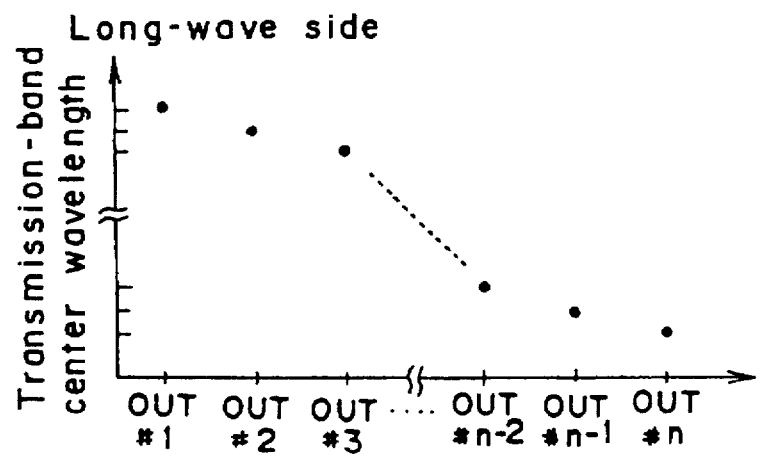
FIG. 33 is a diagram showing characteristics of the optical-filter array shown in FIG. 32.

FIG. 33 is a diagram showing characteristics of the optical-filter array shown in FIG. 32. The ordinate of the figure represents the transmission-band center wavelength whereas the abscissa represents the channel numbers of the output ports 86 (#1 to #n). In this embodiment, the optical fibers are installed at equal intervals as described above, resulting in a uniform difference in transmission-band center wavelength between any two adjacent channels.

Figure 34:
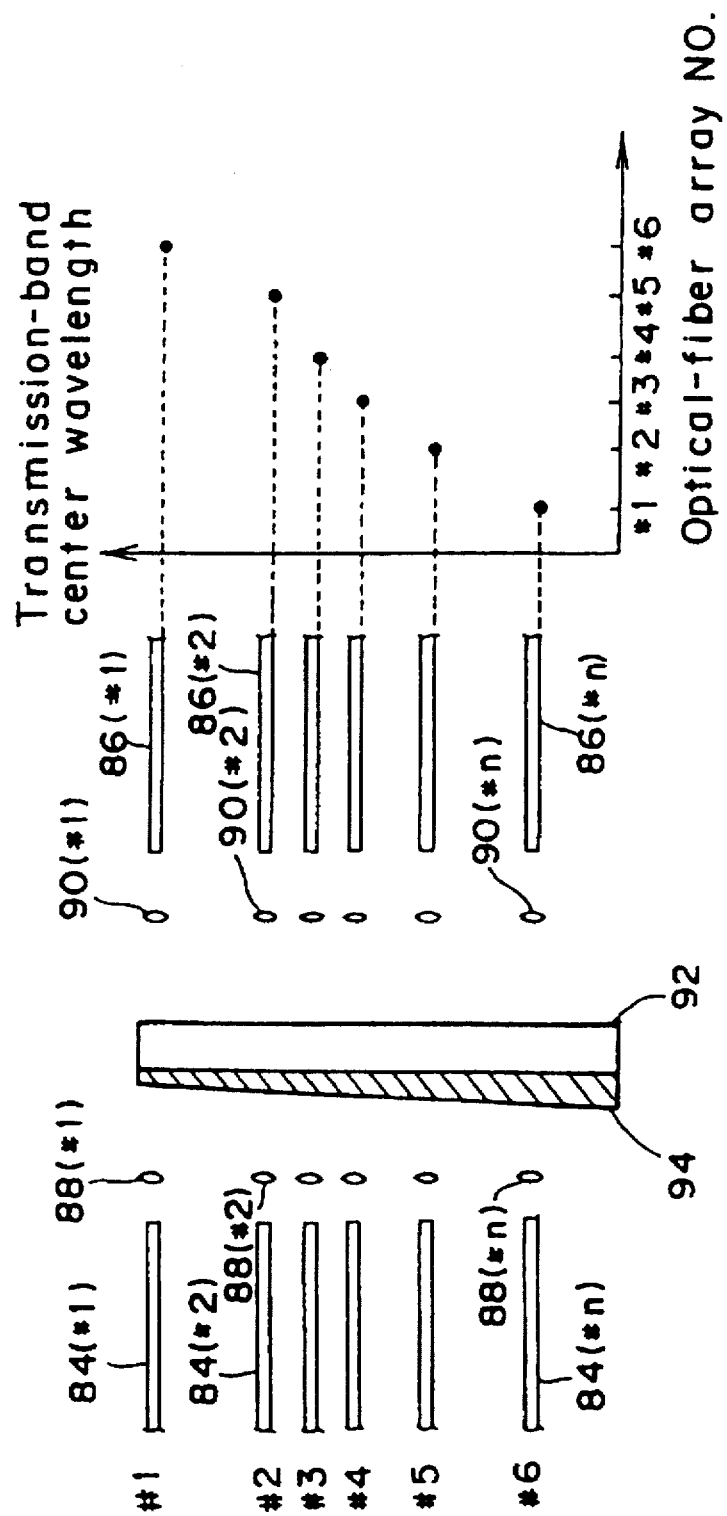
FIG. 34 is a view showing a second concrete embodiment of the optical-filter array shown in FIG. 12.

FIG. 34 is a view showing a second concrete embodiment of the optical-filter array shown in FIG. 12. In comparison with the first embodiment shown in FIG. 32, the second embodiment is characterized in that neither the input-side optical fibers 84 (#1 to #n) nor the output-side optical fibers 86 (#1 to #n) are placed at equal intervals. Therefore, the transmission-band center wavelengths of the optical-filter array can also be set at unequal intervals. As a result, effects of four-wave mixing can be eliminated in the implementation of the WDM technique. Refer to a document written by F. Forghieri et al. with the title "Reduction of Four-Wave-Mixing Cross Talk in WDM Systems Using Unequally Spaced Channels", OFC/IOOC "93, Technical Digest FC4. As an alternative, an equally spaced optical-filter array with a wavelength interval sufficiently narrower than the wavelength interval among signal lights in the WDM system is created and only input and output ports corresponding to desired transmission-band center wavelengths are selected. In this way, an optical-filter array with a desired interval or an unequally spaced optical-filter array can be obtained.

Figure 35:
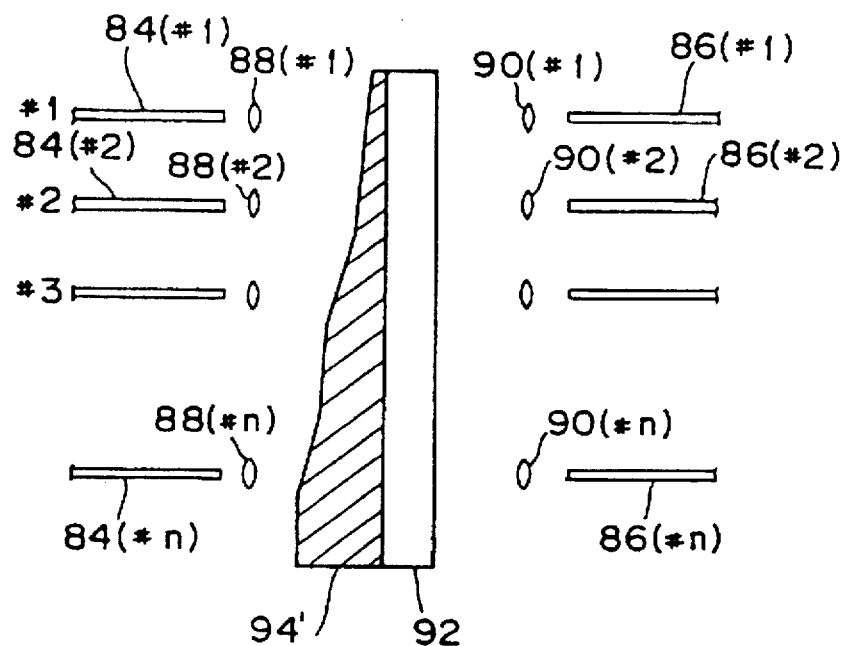
FIG. 35 is a view showing a third concrete embodiment of the optical-filter array shown in FIG. 12.
Figure 36:
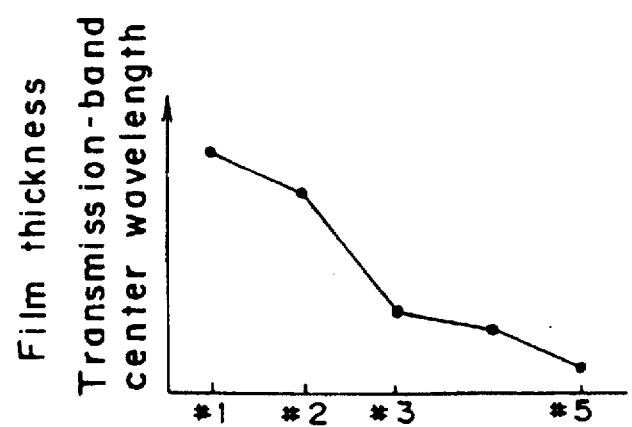
FIG. 36 is a diagram showing a characteristic of the optical-filter array shown in FIG. 35.

FIG. 35 is a view showing a third concrete embodiment of the optical-filter array shown in FIG. 12. The third embodiment is suitable for a case in which the wavelength reproducibility in the technology for manufacturing the interference filter is good. As shown in FIG. 35, optical fibers for the input and output ports are provided at equal intervals and a dielectric multilayer film 94' has a variable film-thickness distribution. In such a design, a desired transmission-band center wavelength can be assigned to each optical filter element. FIG. 36 is a diagram showing a characteristic of the optical-filter array shown in FIG. 35.

Figure 37:
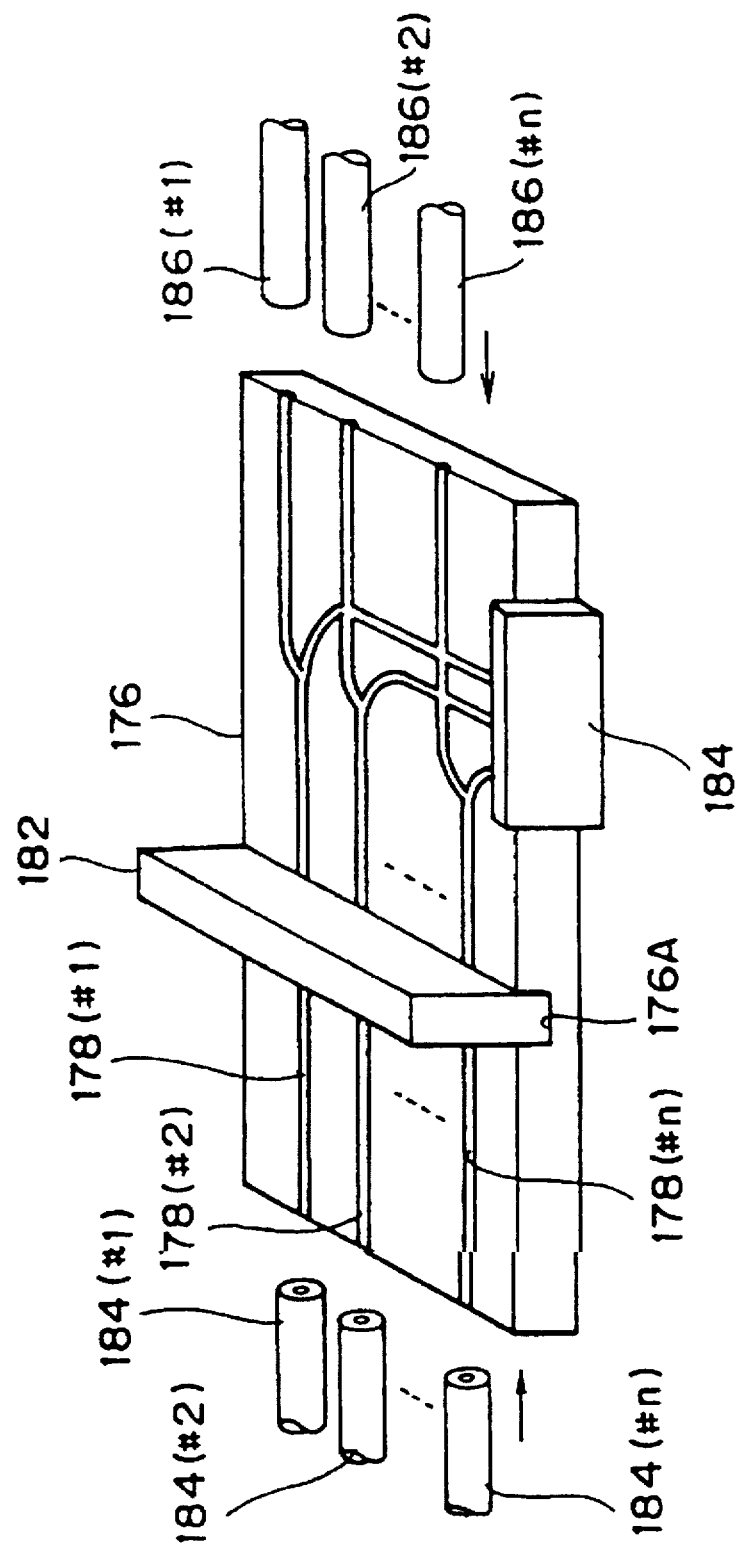
FIG. 37 is a perspective view showing a fourth embodiment of the optical-filter array.

FIG. 37 is a diagram showing a fourth embodiment of the optical-filter array. In this embodiment, a plurality of optical wave guides 178 (#1 to #n) are arranged on a optical wave-guide substrate 176 and a groove 176A crossing the optical wave guides 178 (#1 to #n) is created on the optical wave-guide substrate 176. An interference filter 182 having position-dependent transmission-band center optical wavelengths is inserted into the groove 176A. Reference numeral 184 (#1 to #n) denote input-side optical fibers connected to the input ports of the optical wave guides 178 (#1 to #n) while reference numeral 186 (#1 to #n) denote output-side optical fibers connected to the output ports of the optical wave guides 178 (#1 to #n). In addition, a branch is created to split each of the optical wave guides 178 (#1 to #n) on the down-stream side of the interference filter 182 into two split guides. One of the split guides of each the optical wave guides 178 (#1 to #n) is optically connected to a photodiode array 184.

Figure 38:
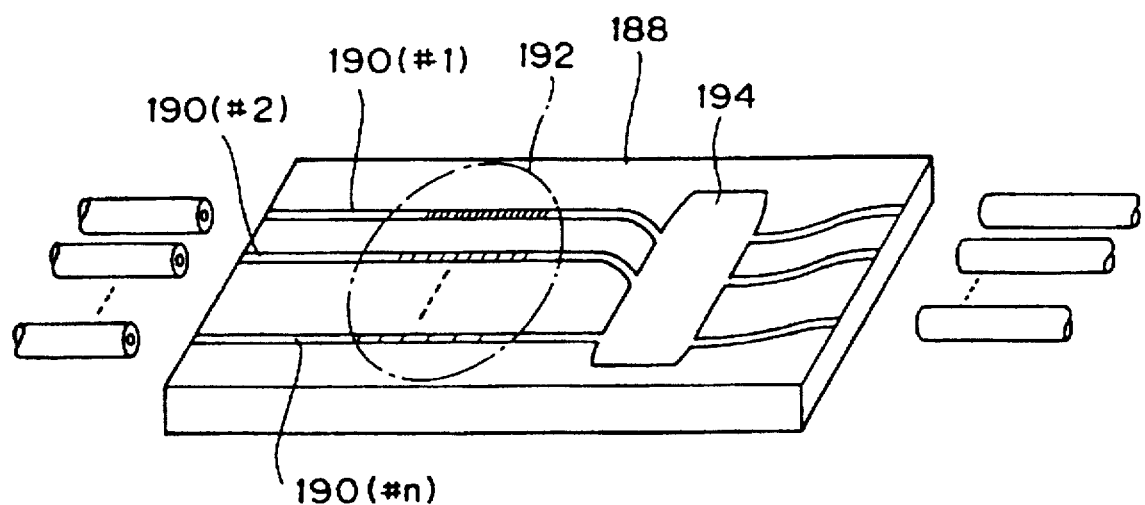
FIG. 38 is a perspective view showing a fifth embodiment of the optical-filter array.

FIG. 38 is a view showing a fifth embodiment of the optical-filter array. In this embodiment, a plurality of optical wave guides 190 (#1 to #n) are arranged on a wave-guide substrate 188. On the optical wave guides 190 (#1 to #n), an area 192 for creating grating-type filters and an optical star coupler area 194 are provided. When the transmission-band center wavelengths of the grating-type filters can not be set accurately, more optical wave guides than required for the WDM system are created. The lattice constants of the grating portions of the optical wave guides are slightly shifted from each other and only optical wave guides matching the desired wavelengths are selectively used. In this way, the yield of the optical-filter array can be improved. In this embodiment, the optical star coupler area 194 is created as described above. Accordingly, if unused optical wave guides exist, the amount of insertion loss is increased by a quantity determined by the existing unused optical wave guides. None the less, optical amplifiers are used for compensating signal lights for the insertion loss. As a result, this problem can be solved.

According to the description given so far, the optical-filter array is assumed to have a one-dimensional layout only for the sake of explanation simplicity. It should be noted, however, that the optical-filter array can also have naturally a two-dimensional layout as well. In the case of an absorption line of molecules or atoms used to serve as an absolute wavelength reference, for example, it can also be expected that the reference wavelength happens to be a halfway wavelength which does not match the arrangement of the wavelengths of the signal lights. An example of a halfway wavelength is a wavelength between wavelengths of signal lights. By spatially separating the position for a light generated by the absolute wavelength reference to pass through the optical-filter array from the positions for signal lights to pass through the optical-filter array, a desired wavelength reference can be used. This arrangement is accomplished in concrete terms as follows.

Figure 39:
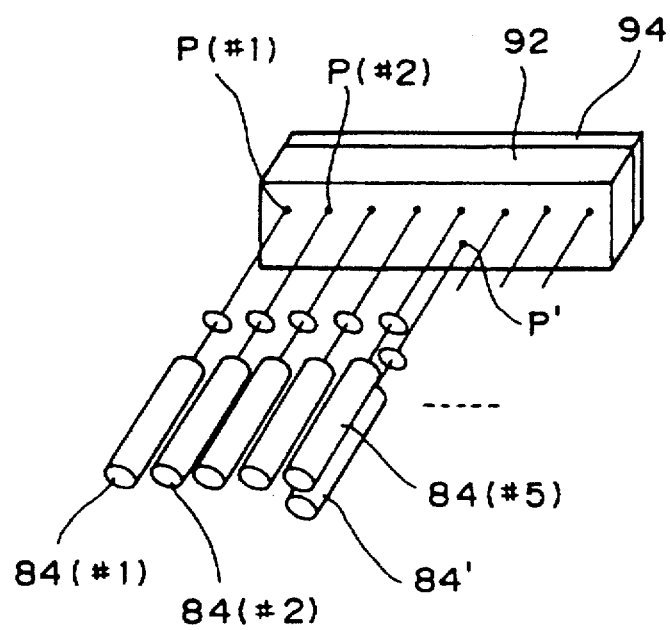
FIG. 39 is a perspective view showing a sixth embodiment of the optical-filter array.

FIG. 39 is a view showing a sixth embodiment of the optical-filter array. In this embodiment, optical fibers 84 (#1 to #n) serving as input ports for signal lights are arranged in parallel to each other. An optical fiber 84' serving as an input port of the absolute wavelength reference is provided at a position shifted away from the optical fibers 84 (#1 to #n) in a direction perpendicular to the arrangement direction thereof. Notation P (#1 to #n) denote points on the optical-filter array which the incident beams of signal lights hit. Likewise, notation P' denotes a point on the optical-filter array which the incident beam from the absolute wavelength reference hits.

In the case of an optical-filter array manufactured from dielectric films, the diameter of the light beam passing through the optical-filter array is an important parameter. A light beam passing through the optical-filter array, which light beam is thicker than the gap between two adjacent optical fibers, gives rise to cross talk with other signals. In addition, a light beam passing through the optical-filter array having different transformation wavelengths, which light beam is thick in comparison with the change in optical-filter transmission wavelength, inevitably widens the 3-dB transmission wavelength band. In the case of an optical-fiber array with the transmission-band center wavelengths thereof varying depending upon the position like the one shown in FIG. 32, for example, dielectric films are placed one layer upon another to form such an embodiment that the transmission-band center wavelength changes by 10 nm for a positional displacement of 10 mm. In this case, in order to create an equally spaced optical-filter array having a transmission-band center wavelength interval of 1 nm, it is required that optical fibers be arranged at 1-mm intervals.

In the design of such an optical filter, let the 3-dB transmission bandwidth with a fixed film-thickness distribution be 0.5 nm. In order to prevent its characteristic from deteriorating, it is required that the light-beam diameter be set at a value sufficiently smaller than 0.5 mm which corresponds to the 0.5-nm width of the 3-dB transmission band. For a large light-beam diameter, the transmission-band center wavelength changes inside the light beam. On the top of that, the light beam is larger than the 3-dB transmission bandwidth of the optical filter's main body. As a result, the transmission and cut-off characteristics deteriorate. In order to solve this problem, it is desirable to squeeze the light beam diameter by setting the focus of a lens provided in close proximity to the excitement end of the optical fiber to a sufficiently small value. It should be noted that, for a light-beam diameter of 50 microns and a fiber-array spacing of 1 mm, the ratio of the fiber-array spacing to the light-beam diameter can be considered to be sufficiently high, allowing effects of cross talk on other channels to be all but eliminated.

Figure 40A:
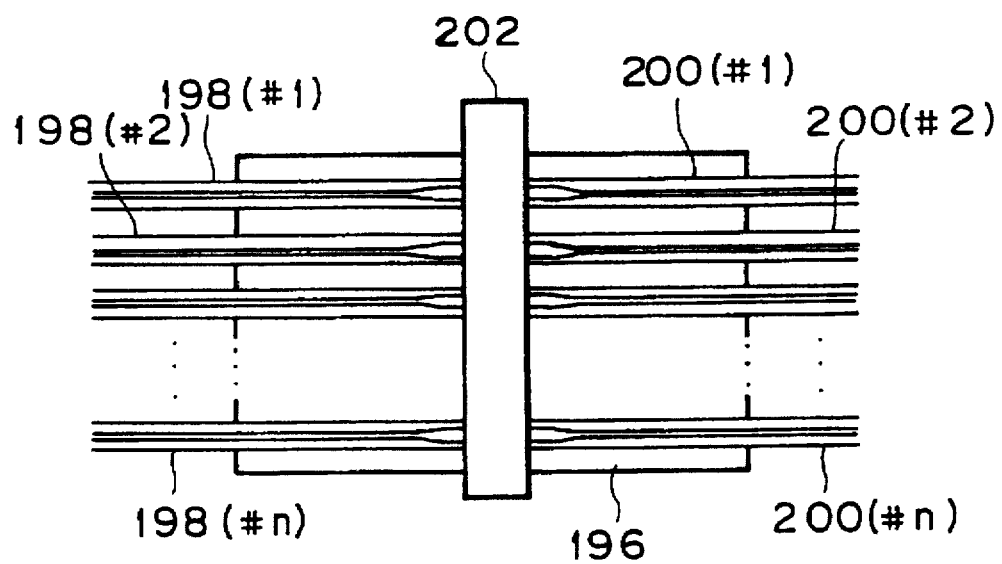
FIGS. 40A and 40B are respectively a plan view and a side view of a seventh embodiment of the optical-filter array.
Figure 40B:
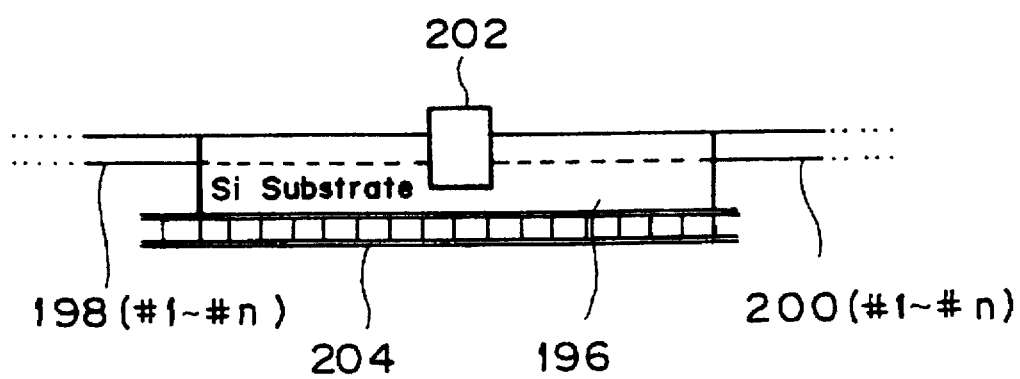

A seventh embodiment for solving such a technical problem is described below by referring to FIGS. 40A and 40B. FIGS. 40A and 40B are respectively a plan view and a side view of the seventh embodiment of the optical-filter array. As shown in the figures, a plurality of V grooves parallel to each other are created on a substrate 196. Input-side optical fibers 198 (#1 to #n) having increased mode-field diameters (MFDs) at their ends are plugged into the V grooves. The input-side fibers 198 (#1 to #n) are arranged with their end surfaces aligned. Likewise, output-side optical fibers 200 (#1 to #n) having increased mode-field diameters (MFDs) at their ends are also arranged on the V grooves so as to correspond to the input-side fibers 198 (#1 to #n) on a one-to-one basis. An optical-filter array 202 is inserted between the input-side fibers 198 (#1 to #n) and the output-side fibers 200 (#1 to #n). Reference numeral 204 is a Peltier device used for controlling the temperature of the substrate 196. The reason why input and output optical fibers 198 and 200 (#1 to #n) having increased mode-field diameters (MFDs) at their ends are employed is to reduce the amount of insertion loss of the optical-filter array 202 which has a limited thickness. For detailed information on the technology for manufacturing such optical fibers, refer to a document written by M. Kihara et al. with the title "Loss Characteristics of Thermally Diffused Expanded Core Fiber", IEEE Photonics Technology Letters, Vol. 4, No. 12, pp 1390–1391 and a document written by Chuuzenji et al. with the title "Optical Fiber Integration Type Polarization Independent Isolators", presented to a fall conference of the Academic Society of Electronic, Information and Communication Engineers, 1992, C-229. Such an optical fiber is referred to hereafter as a TEC fiber.

Figure 41:
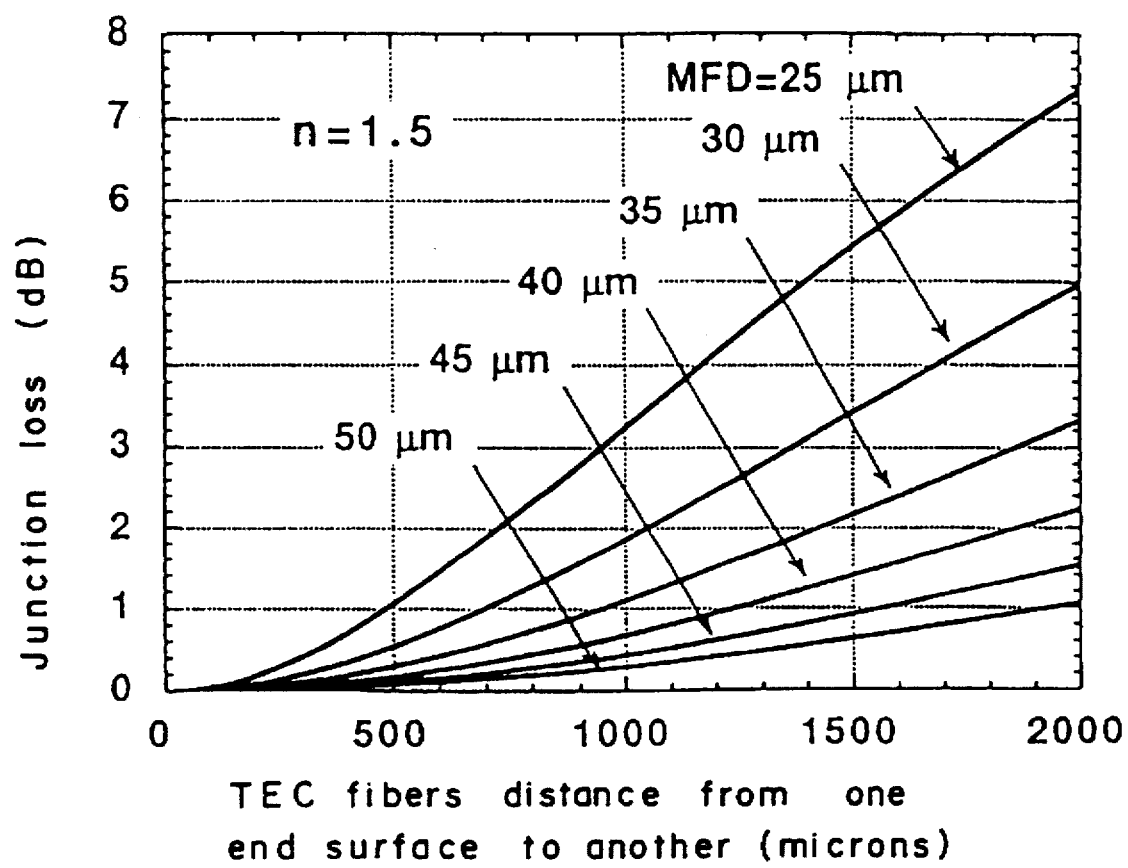
FIG. 41 is a graph showing relation between the junction loss and the distance from one end surface to another of a TEC fiber.

FIG. 41 shows a graph representing relation between the junction loss and the distance from one end surface to another of a pair of TEC fibers serving as input and output fibers respectively with space between the end surfaces of each of the TEC fibers filled up with an optical medium having a refraction index of 1.5, which graph is drawn with the mode-field diameter (MFD) taken as a parameter. It is obvious from the graph that the insertion loss can be suppressed to an amount smaller than 0.5 dB with the distance from one end surface to another set at 1,000 microns and the mode-field diameter (MFD) increased to 40 microns.

Figure 42:
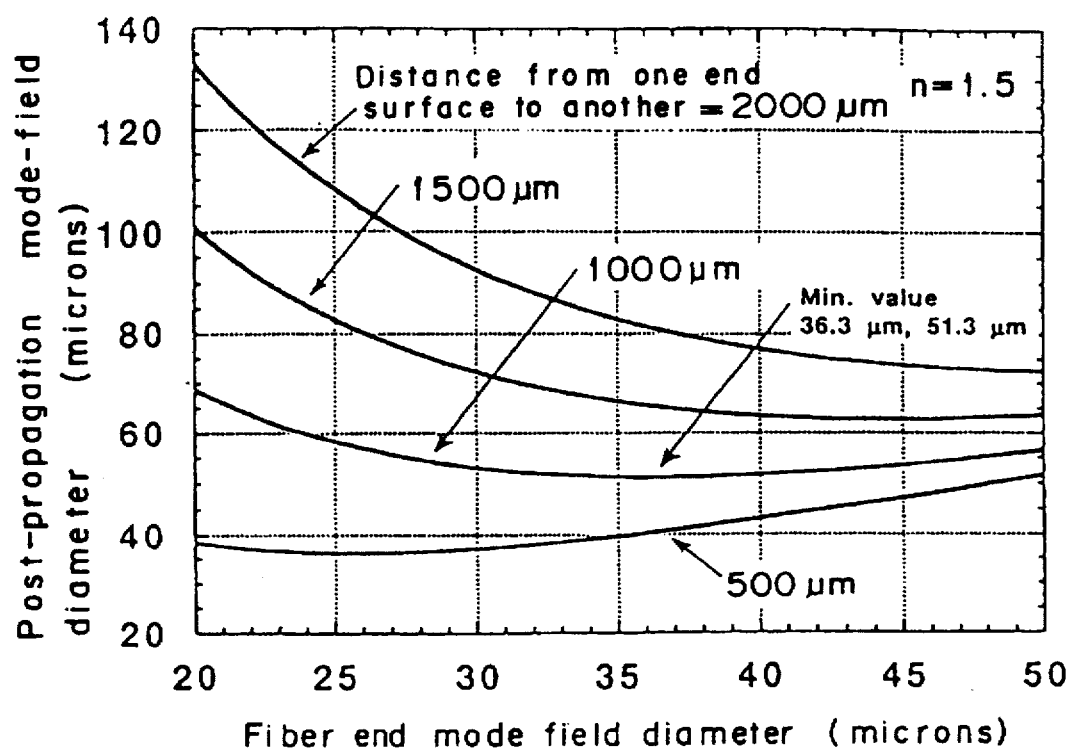
FIG. 42 is a graph showing relation between the post-propagation MFD and the MFD at the fiber end.

FIG. 42 shows a graph representing relation between the post-propagation MFD and the MFD at the fiber end. It is obvious that, with the MFD at the fiber end increased to 40 microns, the beam diameter is only about 50 microns even after a propagation along a distance of 1,000 microns, providing a condition that does not cause the transmission width to deteriorate as described earlier.

As described above, the present invention has an effect of coping with fluctuations in wavelength that occur on the transmitter side. On the top of that, optical fibers required for implementing the WDM technique can be obtained with a high degree of accuracy and a high degree of stability, allowing a WDM system intended for practical use to be built using such optical fibers.

It should be noted that the present invention is not limited to the details of the preferred embodiments described above. The scope of the present invention is defined by the appended claims and all changes and modifications as fall within the equivalence of the scope of the claims are therefore to be embraced by the present invention.

What is claimed is:

1. An optical transmitter comprising:
   a light source;
   a band-pass filter for filtering a light generated by the light source, said band-pass filter having a predetermined pass band;
   a light splitting means for splitting a light output by said band-pass filter into at least two split lights;
   an optical receiving unit for converting one of said split lights into an electrical signal having a level corresponding to the intensity thereof; and a control means for controlling the wavelength of said light source based on said electrical signal such that said wavelength is kept constant within said predetermined pass band of said band-pass filter.

2. An optical transmitter according to claim 1 wherein:

said band-pass filter has a narrow-band characteristic representing a relation between the transmissivity of said band-pass filter and the wavelength of a light passing through said band-pass filter;

said control means comprises an oscillator for generating a low-frequency signal, a means for carrying out frequency modulation at a low degree of modulation on said light source by using said low-frequency signal, and a synchronization detecting means for receiving said low-frequency signal and said electrical signal for use in detecting low-frequency components included in said electrical signal; and the wavelength of said light source is controlled in such a way that said wavelength matches a wavelength that provides a peak of said narrow-band characteristic of said band-pass filter.

3. An optical transmitter according to claim 1 further comprising a means for generating a modulating signal based on transmitting data and a modulating means for modulating a light generated by said light source by using said modulating signal.

4. An optical transmitter according to claim 3 wherein said modulating means comprises an optical modulator of a Mach-Zehnder type having an input port and an output port optically connected to said light source and said band-pass filter respectively.

5. An optical transmitter according to claim 4 further comprising an automatic bias controlling means for controlling an operating point of said Mach-Zehnder-type optical modulator in accordance with said electrical signal output by said optical receiving unit and an automatic power controlling means for controlling an output intensity of said light source in accordance with said electrical signal output by said optical receiving unit.

6. An optical transmitter according to claim 5 further comprising a means for operating said control means, said automatic bias controlling means and said automatic power controlling means on a time-division basis.

7. An optical transmission system for transmission adopting a wavelength division multiplexing technique, said optical transmission system comprising:

a plurality of optical transmitters each for outputting a signal light; and an optical multiplexer for multiplexing said signal lights generated by said optical transmitters and outputting a multiplexed light to one optical transmission line or more optical transmission lines, wherein each of said optical transmitters includes:

a light source;

a band-pass filter for filtering a light generated by said light source, said band-pass filter having a predetermined pass band;

a light splitting means for splitting a light output by said band-pass filter into at least two split lights;

an optical receiving unit for converting one of said split lights into an electrical signal having a level corresponding to the intensity thereof; and a control means for controlling the wavelength of said light source based on said electrical signal such that said wavelength is kept constant within said predetermined pass band of said band-pass filter, and wherein another one of said split lights is transmitted as said signal light.

8. An optical transmission system according to claim 7 wherein said band-pass filters are filter elements constituting an optical-filter array of a space-division type having a plurality of input ports and as many output ports as said input ports.

9. An optical transmission system according to claim 8 wherein:

said optical-filter array includes a wave-guide substrate having a plurality of wave-guide diffracting lattices with lattice constants different from each other; and input and output terminals of said wave-guide diffracting lattices serve as said input ports and said output ports respectively.

10. An optical transmission system according to claim 8 wherein:

said optical-filter array includes a substrate having a plurality of V grooves and a plurality of fiber-grating-typed optical filters with lattice constants different from each other sitting on said V grooves; and input and output terminals of said fiber-grating-typed optical filters serve as said input ports and said output ports respectively.

11. An optical transmission system according to claim 8 wherein:

said input ports are a plurality of input-side optical fibers placed in parallel to each other;

said output ports are a plurality of output-side optical fibers placed in parallel to each other and correspond to said input-side optical fibers on a one-to-one basis;

a plurality of optical paths are created between said input-side optical fibers and said output-side optical fibers; and said optical-filter array includes a transparent substrate provided in such a way that said transparent substrate is entangled with said optical paths and interference films placed one layer upon another on said transparent substrate with thicknesses thereof smoothly changing in an arranging direction of said optical paths in said optical-filter array.

12. An optical transmitter comprising:

a light source;

a band-pass filter for filtering a light generated by the light source, said band-pass filter having a predetermined pass band;

a light splitting means for splitting a light output by said band-pass filter into at least two split lights;

an optical receiving unit for converting one of said split lights into an electrical signal having a level corresponding to the intensity thereof;

a control means for controlling the wavelength of said light source based on said electrical signal such that said wavelength is kept constant within said predetermined pass band of said band-pass filter; and wherein said band-pass filter includes filter elements constituting an optical filter array of a space division type having a plurality of input ports and as many output ports as said input ports.

* * * * *